United States Patent
Hanamura et al.

(10) Patent No.: US 7,320,854 B2
(45) Date of Patent: Jan. 22, 2008

(54) RADIATION SENSITIVE REFRACTIVE INDEX CHANGING COMPOSITION, PATTERN FORMING METHOD AND OPTICAL MATERIAL

(75) Inventors: Masaaki Hanamura, Tokyo (JP); Michinori Nishikawa, Tokyo (JP); Atsushi Kumano, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/874,391

(22) Filed: Jun. 24, 2004

(65) Prior Publication Data

US 2004/0265737 A1 Dec. 30, 2004

(30) Foreign Application Priority Data

Jun. 25, 2003 (JP) .................. 2003-180855

(51) Int. Cl.
- G03F 7/00 (2006.01)
- G03F 7/004 (2006.01)
- G03F 7/029 (2006.01)

(52) U.S. Cl. .............. 430/270.1; 264/1.21; 264/1.36
(58) Field of Classification Search .......... 430/270.1; 264/1.21, 1.36
See application file for complete search history.

(56) References Cited

U.S. PATENT DOCUMENTS

| | | | |
|---|---|---|---|
| 4,173,474 A | 11/1979 | Tanaka et al. | |
| 5,204,218 A | 4/1993 | Kumada et al. | |
| 5,450,232 A | 9/1995 | Sasaki et al. | |
| 5,492,744 A * | 2/1996 | Koike et al. | 428/64.1 |
| 5,593,621 A | 1/1997 | Koike et al. | |
| 5,627,010 A | 5/1997 | Pai et al. | |
| 5,723,262 A * | 3/1998 | Nakamura et al. | 430/286.1 |
| 6,210,858 B1 * | 4/2001 | Yasuda et al. | 430/270.1 |
| 6,268,089 B1 * | 7/2001 | Chandross et al. | 430/1 |
| 6,495,309 B1 * | 12/2002 | Brabbs et al. | 430/271.1 |
| 6,627,354 B1 * | 9/2003 | Chandross et al. | 430/1 |
| 6,777,706 B1 * | 8/2004 | Tessler et al. | 257/17 |
| 6,787,289 B2 * | 9/2004 | Yamada et al. | 430/281.1 |
| 6,828,078 B2 * | 12/2004 | Nishimura et al. | 430/270.1 |
| 6,908,655 B2 * | 6/2005 | Arakawa et al. | 428/64.1 |

FOREIGN PATENT DOCUMENTS

| | | |
|---|---|---|
| EP | 0 589 241 A2 | 8/1993 |
| EP | 0 965 618 A1 | 12/1999 |
| EP | 1 235 104 A1 | 8/2002 |
| EP | 1 350 814 A1 | 10/2003 |
| EP | 1 369 459 A1 | 12/2003 |
| EP | 1 375 597 A1 | 1/2004 |
| EP | 1 471 540 A1 | 10/2004 |
| JP | 62-25705 | 2/1987 |
| JP | 3-192310 | 8/1991 |
| JP | 4-330444 | 11/1992 |
| JP | 5-60931 | 3/1993 |
| JP | 7-56026 | 3/1995 |
| JP | 7-92313 | 4/1995 |
| JP | 8-336911 | 12/1996 |
| JP | 8-337609 | 12/1996 |
| JP | 9-133813 | 5/1997 |
| JP | 9-178901 | 7/1997 |
| JP | 2002-296402 | 10/2002 |
| JP | 2002-309110 | 10/2002 |
| JP | 2002-338828 | 11/2002 |
| JP | 2002-338829 | 11/2002 |
| WO | WO93/19505 | 9/1993 |
| WO | WO94/04949 | 3/1994 |
| WO | WO 01/53420 A1 | 7/2001 |
| WO | WO 02/06651 A1 | 8/2002 |
| WO | WO 03/034150 A1 | 4/2003 |

* cited by examiner

*Primary Examiner*—Amanda C. Walke
(74) *Attorney, Agent, or Firm*—Oblon, Spivak, McClelland, Maier & Neustadt, P.C.

(57) ABSTRACT

There is provided a radiation sensitive refractive index changing composition containing an inorganic oxide particle, a polymerizable compound, a radiation sensitive decomposer and an escapable compound. The radiation sensitive decomposer decomposes upon exposure to radiation to form an acid, base or radical, and this decomposed product increases the molecular weight of the polymerizable compound.

20 Claims, No Drawings

RADIATION SENSITIVE REFRACTIVE INDEX CHANGING COMPOSITION, PATTERN FORMING METHOD AND OPTICAL MATERIAL

FIELD OF THE INVENTION

The present invention relates to a radiation sensitive refractive index changing composition, refractive index pattern forming method, refractive index pattern and optical material. More specifically, it relates to a refractive index pattern forming method which provides a novel refractive index pattern and an optical material for use in optoelectronic and display fields, and a radiation sensitive refractive index changing composition advantageously used in the method.

DESCRIPTION OF THE PRIOR ART

In the current society called "multi-media society", refractive index distribution type optically molded products, each composed of different refractive index regions, are in great demand. The products include not only optical fibers for transmitting information but also optical diffraction gratings having a periodical change in refractive index, optical memories in which information is written at sites having different refractive indices, optically coupled devices such as optical IC's having a fine refractive index pattern, optical control devices, optical modulation devices and optical transmission devices.

The refractive index distribution type optically molded products are divided into two types: one having a continuous refractive index distribution in the product, such as GI type optical fibers (to be referred to as "GRIN optically molded products" hereinafter) and the other having a discontinuous refractive index distribution, such as optical diffraction gratings and SI type optical waveguides.

The GRIN optically molded products are attracting much attention as the next-generation optically molded products. For example, a GI type optical fiber whose refractive index is reduced from the center axis of the core of the optical fiber to the periphery in a parabolic form can transmit a large volume of information. A GRIN lens whose refractive index continuously changes therein is used as a read lens for use in copiers, spherical lens for connecting fibers, or micro-lens, making use of its characteristic features that it has refractive power even on a flat surface and that it is free from spherical aberration.

A large number of methods of producing the above GRIN optically molded products have been proposed up till now. For example, JP-A 9-133813, JP-A 8-336911, JP-A 8-337609, JP-A 3-192310, JP-A 5-60931 (the term "JP-A" as used herein means an "unexamined published Japanese patent application"), WO93/19505 and WO94/04949 disclose a method of obtaining a GI type optical fiber by dispersing a low molecule weight compound or a monomer into a polymer and continuously distributing its concentration. JP-A 62-25705 discloses that a rod-like GI type optically molded product or optical fiber is obtained by photocopolymerizing two or more vinyl monomers having different refractive indices and reactivity ratios. Further, JP-A 7-56026 discloses a method of obtaining a refractive index distribution by forming a polymer A having a photoreactive functional group, dispersing a compound B having a lower refractive index than the polymer A into the polymer A to form the concentration distribution of the compound B, and photo-reacting the polymer A with the compound B.

Some methods of producing GRIN optically molded products of an inorganic material are also proposed. One of them is, for example, a method of producing a GI type rod by adding high refractive index thallium to a rod-like glass essentially composed of silicon or lead, immersing the glass in a molten solution containing low refractive index potassium, and forming a potassium concentration distribution by ion exchange.

A GRIN lens can be obtained likewise by applying the above method to a short rod, that is, lens-like optically molded product. Alternatively, the GI type rod produced by the above method may be sliced.

As one of the methods of producing an optically molded product having a fine refractive index pattern, such as the above optical diffraction grating or optical IC, there is known a technology for obtaining a change in refractive index by causing a photochemical reaction in a molded product through exposure to light. For instance, in the case of an inorganic material, glass doped with germanium is exposed to light to change its refractive index so as to produce an optical diffraction grating. In the case of an organic material, the above technology is known as a photochromic reaction or photobleaching. JP-A 7-92313 discloses a technology for obtaining an optical diffraction grating by causing a change in the refractive index of a material containing a low molecular weight compound having photochemical reactivity dispersed in a polymer through exposure to a laser beam. Further, JP-A 9-178901 has recently proposed the application of this technology to the production of a GRIN optically molded product. This method provides a continuous refractive index distribution in a depth direction with respect to irradiation, making use of a phenomenon that light applied to a molded product is absorbed and weakened in intensity.

However, in the refractive index distributions obtained with the above conventional materials, the maximum refractive index difference is only about 0.001 to 0.02, and it is difficult to provide a wider refractive index distribution for the prevention of an optical loss and the suppression of the malfunction of a circuit.

Further, when the above conventional materials are used under the condition that light having a wavelength close to the wavelength used to change the refractive index passes therethrough after a refractive index distribution is formed, it is impossible to prevent a phenomenon that a gradual change in refractive index occurs, thereby causing deterioration.

SUMMARY OF THE INVENTION

It is an object of the present invention to provide a refractive index pattern and an optical material which are obtained by changing the refractive index of a material by a simple method, whose refractive index differences are sufficiently large and which are stable regardless of use conditions, as well as novel methods of forming the same.

Other objects and advantages of the present invention will become apparent from the following description.

According to the present invention, firstly, the above objects and advantages of the present invention are attained by a radiation sensitive refractive index changing composition which comprises (A) an inorganic oxide particle, (B) a polymerizable compound, (C) a radiation sensitive decomposer, and (D) an escapable compound.

Secondly, the above objects and advantages of the present invention are attained by a method of forming a refractive index pattern, comprising applying radiation to part of the above radiation sensitive refractive index changing composition.

Thirdly, the above objects and advantages of the present invention are attained by a refractive index pattern formed by the above method of forming a refractive index pattern.

In the fourth place, the above objects and advantages of the present invention are attained by an optical material having a refractive index pattern formed by the above method of forming a refractive index pattern.

In the present invention, the "refractive index pattern" means a refractive index distribution type material comprising regions which differ in refractive index.

DETAILED DESCRIPTION OF THE PREFERRED EMBODIMENT

Each of the components of the refractive index changing composition used in the present invention will be described in detail hereinunder.

(A) Inorganic Oxide Particle

Almost all kinds of inorganic oxide particles may be used as the component (A). Preferably, the inorganic oxide particle is stable to an acid, base or radical formed from the radiation sensitive decomposer (C) which will be described hereinafter, does not absorb used light having a specific wavelength range when it passes therethrough, and has high optical transparency. A preferred value may be selected as the refractive index of the oxide particle according to application purpose.

Preferred examples of the oxide particle include oxides containing an atom such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Bi or Te. More preferred examples of the oxide particle include oxides such as BeO, MgO, CaO, SrO, BaO, $Sc_2O_3$, $Y_2O_3$, $La_2O_3$, $Ce_2O_3$, $Gd_2O_3$, $Tb_2O_3$, $Dy_2O_3$, $Yb_2O_3$, $Lu_2O_3$, $TiO_2$, $ZrO_2$, $HfO_2$, $Nb_2O_5$, $MoO_3$, $WO_3$, ZnO, $B_2O_3$, $Al_2O_3$, $SiO_3$, $GeO_2$, $SnO_2$, PbO, $Bi_2O_3$ and $TeO_2$, and composite oxides containing these such as $Al_2O_3$—MgO, $Al_2O_3$—$SiO_2$, ZnO—$Y_2O_3$, $ZrO_2$—$Ce_2O_3$, $ZrO_2$—$TiO_2$—$SnO_2$, $TeO_2$—BaO—ZnO, $TeO_2$—$WO_3$—$Ta_2O_5$, $TeO_2$—$WO_3$—$Bi_2O_3$, $TeO_2$—BaO—PbO, CaO—$Al_2O_3$, CaO—$Al_2O_3$—BaO, CaO—$Al_2O_3$—$Na_2O$, CaO—$Al_2O_3$—$K_2O$, CaO—$Al_2O_3$—$SiO_2$, PbO—$Bi_2O_3$—BaO, PbO—$Bi_2O_3$—ZnO, PbO—$Bi_2O_3$, PbO—$Bi_2O_3$—BaO—ZnO, PbO—$Bi_2O_3$—CdO—$Al_2O_3$, PbO—$Bi_2O_3$—$GeO_2$, PbO—$Bi_2O_3$—$GeO_2$—$Tl_2O$, BaO—PbO—$Bi_2O_3$, BaO—PbO—$Bi_2O_3$—ZnO, $Bi_2O_3$—$Ga_2O_3$—PbO, $Bi_2O_3$—$Ga_2O_3$—CdO and $Bi_2O_3$—$Ga_2O_3$—(Pb, Cd)O.

The particle diameter of the oxide particle is preferably smaller than the wavelength of light used for the refractive index changing composition of the present invention and can be, for example, 2 μm or less, preferably. 0.2 μm or less, particularly preferably 0.1 μm or less. When the particle diameter is larger than 2 μm, the transparency of the obtained refractive index changing composition may lower or a film obtained therefrom may have a problem with its surface state.

The shape of the oxide particle is not particularly limited but preferably substantially spherical because the scattering of incident light is small.

The above oxide particle may be brought into contact with a silane coupling agent, surfactant or coordination compound having coordination capability to a metal atom constituting the oxide so as to modify the surface of the particle before use.

(B) Polymerizable Compound

A polymer whose crosslinking density is increased by an acid, base or radical formed from the radiation sensitive decomposer (C) may be used as the polymerizable compound (B). The component (B) is, for example, a polymer having an ethylenically unsaturated bond, epoxy group, episulfide group, oxetanyl group, oxazolyl group, oxazinyl group or maleimide group, or a polysiloxane having the residual alkoxy group.

The polymer having an ethylenically unsaturated bond, epoxy group, episulfide group, oxetanyl group, oxazolyl group, oxazinyl group or maleimide group may be a homopolymer of a monomer having an epoxy group, episulfide group, oxetanyl group, oxazolyl group, oxazinyl group or maleimide group, or a copolymer of the above monomer and other radically polymerizable monomer. Examples of the other radically polymerizable monomer include monocarboxylic acids such as acrylic acid, methacrylic acid and crotonic acid; dicarboxylic acids such as maleic acid, fumaric acid, citraconic acid, mesaconic acid and itaconic acid; anhydrides of these dicarboxylic acids; alkyl methacrylates such as methyl methacrylate, ethyl methacrylate, n-butyl methacrylate, sec-butyl methacrylate and t-butyl methacrylate; alkyl acrylates such as methyl acrylate and isopropyl acrylate; cyclic alkyl methacrylates such as cyclohexyl methacrylate, 2-methylcyclohexyl methacrylate, tricyclo[$5.2.1.0^{2,6}$]decan-8-yl methacrylate (commonly called "dicyclopentanyl methacrylate" in this technical field), dicyclopentanyloxyethyl methacrylate and isobornyl methacrylate; cyclic alkyl acrylates such as cyclohexyl acrylate, 2-methylcyclhexyl acrylate and tricyclo[$5.2.1.0^{2,6}$]decan-8-yl acrylate (commonly called "dicyclopentanyl acrylate" in this technical field), dicyclopentaoxyethyl acrylate and isobornyl acrylate; aryl methacrylates such as phenyl methacrylate and benzyl methacrylate; aryl acrylates such as phenyl acrylate and benzyl acrylate; dicarboxylic diesters such as diethyl maleate, diethyl fumarate and diethyl itaconate; hydroxyalkyl esters such as 2-hydroxyethyl methacrylate and 2-hydroxypropyl methacrylate; and styrene, α-methylstyrene, m-methylstyrene, p-methylstyrene, vinyl toluene, p-methoxystyrene, acrylonitrile, methacrylonitrile, vinyl chloride, vinylidene chloride, acrylamide, methacrylamide, vinyl acetate, 1,3-butadiene, isoprene and 2,3-dimethyl-1,3-butadiene. These radically polymerizable monomers may be used alone or in combination of two or more.

Examples of the monomer having an ethylenically unsaturated bond include allyl acrylate, allyl methacrylate, allyl α-ethyl acrylate, allyl α-n-propyl acrylate, allyl α-n-butyl acrylate, 1-butenyl acrylate, 1-butenyl methacrylate, 2-(2'-vinyloxyethoxy)ethyl acrylate, 2-(2'-vinyloxyethoxy)ethyl methacrylate, 2-(2'-aryloxyethoxy)ethyl acrylate, 2-(2'-aryloxyethoxy)ethyl methacrylate, acryloyloxy-n-propyltetrahydrohydrogen phthalate and methacryloyloxy-n-propyltetrahydrohydrogen phthalate.

Examples of the monomer having an epoxy group include glycidyl acrylate, glycidyl methacrylate, glycidyl α-ethyl acrylate, glycidyl α-n-propyl acrylate, glycidyl α-n-butyl acrylate, 3,4-epoxybutyl acrylate, 3,4-epoxybutyl methacrylate, 6,7-epoxyheptyl acrylate, 6,7-epoxyheptyl methacrylate, methyl glycidyl acrylate, methyl glycidyl methacrylate, ethyl glycidyl acrylate, ethyl glycidyl methacrylate, n-propyl glycidyl acrylate, n-propyl glycidyl methacrylate, n-butyl glycidyl acrylate, n-butyl glycidyl methacrylate, hydroxymethyl acrylate glycidyl ether, hydroxymethyl methacrylate glycidyl ether, 2-hydroxyethyl acrylate glycidyl ether, 2-hydroxyethyl methacrylate glycidyl ether, 3-hydroxy-n-propyl acrylate glycidyl ether, 3-hydroxy-n- propyl methacrylate glycidyl ether, 4-hydroxy-n-butyl acrylate glycidyl ether, 4-hydroxy-n-butyl methacrylate glycidyl ether, 2,3-epoxycyclohexylmethyl acrylate, 2,3-epoxycyclohexylmethyl methacrylate, 3,4-epoxycyclohexylmethyl acrylate, 3,4-epoxycyclohexylmethyl methacrylate, o-vinylbenzyl glycidyl ether, m-vinylbenzyl glycidyl ether, p-vinylbenzyl glycidyl ether, 1,2-epoxy-3-vinylcyclohexane and 1,2-epoxy-4-vinylcyclohexane.

The monomer having an episulfide group may be a monomer obtained by substituting the epoxy group of the above monomer having an epoxy group by an ethylenesulfide group as shown in J. Org. Chem., 28, 229 (1963), for example.

Examples of the monomer having an oxetanyl group include 2-acryloyloxyoxetane, 2-methacryloyloxyoxetane, 3-acryloyloxyoxetane, 3-methacryloyloxyoxetane, 2-acryloyloxymethyloxetane, 2-methacryloyloxymethyloxetane, 3-acryloyloxymethyloxetane, 3-methacryloyloxymethyloxetane, 3-methyl-3-methacryloyloxymethyloxetane, 3-methyl-3-acryloyloxymethyloxetane, 3-ethyl-3-acryloyloxymethyloxetane, 3-ethyl-3-methacryloyloxymethyloxetane, 3-n-propyl-3-acryloyloxymethyloxetane, 3-n-propyl-3-methacryloyloxymethyloxetane, 3-n-butyl-3-acryloyloxymethyloxetane, 3-n-butyl-3-methacryloyloxymethyloxetane, 3-(2'-oxetanemethyloxy)adamantyl acrylate, 3-(2'-oxetanemethyloxy)adamantyl methacrylate, 3-(2'-oxetaneethyloxy)adamantyl acrylate, 3-(2'-oxetaneethyloxy)adamantyl methacrylate, 3-(2'-oxetane-n-propyloxy)adamantyl acrylate, 3-(2'-oxetane-n-propyloxy)adamantyl methacrylate, 2-oxetanemethyloxynorbornene, 2-oxetaneethyloxynorbornene, 2-oxetane-n-propyloxynorbornene, o-vinylbenzyl-2-oxetanylmethyl ether, m-vinylbenzyl-2-oxetanylmethyl ether and p-vinylbenzyl-2-oxetanylmethyl ether.

Examples of the monomer having an oxazolyl group include 2-acryloyloxyoxazoline, 2-methacryloyloxyoxazoline, 2-acryloyloxymethyloxazoline, 2-methacryloylmethoxyoxazoline, 2-acryloylmethoxyoxazoline, 2-methacryloylethoxyoxazoline, 2-acryloylethoxyoxazoline, 2-allyloxazoline, 2-isopropenyl-2-oxazoline, 2-(3-methyl-1-propenyl)oxazoline, 2-(4-butenyl)oxazoline and 2-norbornyl-2-oxazoline.

Examples of the monomer having an oxazinyl group include 2-acryloyloxyoxazine, 2-methacryloyloxyoxazine, 2-acryloyloxymethyloxazine, 2-methacryloylmethoxyoxazine, 2-acryloylmethoxyoxazine, 2-methacryloylethoxyoxazine, 2-acryloylethoxyoxazine, 2-allyloxazine, 2-isopropenyl-2-oxazine, 2-(3-methyl-1-propenyl)oxazine, 2-(4-butenyl)oxazine and 2-norbornyl-2-oxazine.

Examples of the monomer having a maleimide group include (3,4,5,6-tetrahydrophthalimido)methyl acrylate, (3,4,5,6-tetrahydrophthalimido)methyl methacrylate, (3,4,5,6-tetrahydrophthalimido)ethyl acrylate, (3,4,5,6-tetrahydrophthalimido)ethyl methacrylate, 3-(3,4,5,6-tetrahydrophthalimido)-n-propyl acrylate, 3-(3,4,5,6-tetrahydrophthalimido)-n-propyl methacrylate, N-vinylmaleimide, N-allylmaleimide, N-(2-isopropenyl)maleimide and N-(4-butenyl)maleimide.

Examples of the polymerization solvent used for the polymerization of these monomers include alcohols such as methanol and ethanol; ethers such as tetrahydrofuran; glycol ethers such as ethylene glycol monomethyl ether and ethylene glycol monoethyl ether; ethylene glycol alkylether acetates such as methyl cellosolve acetate and ethyl cellosolve acetate; diethylene glycols such as diethylene glycol monomethyl ether, diethylene glycol monoethyl ether, diethylene glycol dimethyl ether, diethylene glycol diethyl ether and diethylene glycol ethyl methyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate.

What is generally known as a radical polymerization initiator may be used as the polymerization initiator used for the production of the polymer having an ethylenically unsaturated bond, epoxy group, episulfide group, oxetanyl group, oxazolyl group, oxazinyl group or maleimide group. Examples of the radical polymerization initiator include azo compounds such as 2,2'-azobisisobutyronitrile, 2,2'-azobis-(2,4-dimethylvaleronitrile) and 2,2'-azobis-(4-methoxy-2,4-dimethylvaleronitrile); organic peroxides such as benzoyl peroxide, lauroyl peroxide, t-butylperoxypivalate and 1,1'-bis-(t-butylperoxy)cyclohexane; and hydrogen peroxide. When a peroxide is used as the radical polymerization initiator, it may be used in combination with a reducing agent as a redox initiator.

The weight average molecular weight in terms of polystyrene (to be referred to as "Mw" hereinafter) of the polymer having an ethylenically unsaturated bond, epoxy group, episulfide group, oxetanyl group, oxazolyl group, oxazinyl group or maleimide group is preferably $1\times10^3$ to $1\times10^5$, more preferably $5\times10^3$ to $5\times10^4$. When Mw is lower than $1\times10^3$, the obtained coating film is not fully cured and hardly obtains mechanical strength. When Mw is higher than $1\times10^5$, high crosslinking contrast between an exposed portion and an unexposed portion is hardly obtained with the result that the difference in refractive index between the exposed portion and the unexposed portion tends to be small.

The polysiloxane is a hydrolyzate of a compound represented by the following formula (1) or a condensate thereof:

$$R^1{}_n Si(OR^2)_{4-n} \qquad (1)$$

wherein $R^1$ and $R^2$ may be the same or different and each a monovalent organic group, and n is an integer of 0 to 2.

In the above formula (1), the monovalent organic group is, for example, an alkyl group, aryl group, allyl group or glycidyl group. Examples of the alkyl group include methyl group, ethyl group, propyl group and butyl group. It is preferably an alkyl group having 1 to 5 carbon atoms. These alkyl groups may be linear or branched and further have a halogen atom such as fluorine atom substituted for a hydrogen atom. In the above formula (1), the aryl group is, for example, a phenyl group or naphthyl, group. In the above formula (1), n is preferably 1 or 2.

Examples of the alkylalkoxysilane represented by the above formula (1) include methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, cyclohexyltrimethoxysilane, cyclohexyltriethoxysilane, cyclohexyltri-n-propoxysilane, cyclohexyltriisopropoxysilane, cyclohexyltri-n-butoxysilane, cyclohexyltri-sec-butoxysilane, cyclohexyltri-tert-butoxysilane, cyclohexyltriphenoxysilane, norbornyltrimethoxysilane, norbornyltriethoxysilane, norbornyltri-n-propoxysilane, norbornyltriisopropoxysilane, norbornyltri-n-butoxysilane, norbornyltri-sec-butoxysilane, norbornyltri-tert-butoxysilane, norbornyltriethoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, dicyclohexyldimethoxysilane, dicyclohexyldiethoxysilane, dicyclohexyldi-n-propoxysilane, dicyclohexyidiisopropoxysilane, dicyclohexyldi-n-butoxysilane, dicyclohexyldi-sec-butoxysilane, dicyclohexyldi-tert-butoxysilane, dicyclohexyldiphenoxysilane, dinorbornyldimethoxysilane, dinorbornyldiethoxysilane, dinorbornyldi-n-propoxysilane, dinorbornyldiIsopropoxysilane, dinorbornyldi-n-butoxysilane, dinorbornyldi-sec-butoxysilane, dinorbornyldi-tert-butoxysilane, dinorbornyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, divinyldimethoxysilane, γ-aminopropyltrimethoxysilane, γ-aminopropyltriethoxysilane, γ-glycidyloxypropyltrimethoxysilane, γ-glycidyloxypropyltriethoxysilane, γ-trifluoropropyltrimethoxysilane and γ-trifluoropropyltriethoxysilane. Compounds obtained by substituting some or all of the hydrogen atoms of the above alkylalkoxysilanes by a fluorine atom are also included. These alkylakoxysilanes may be used alone or in combination of two or more.

Out of the compounds represented by the above formula (1), alkyltrialkoxysilanes in which n is 1 are preferred. Methyltrimethoxysilane and methyltriethoxysilane are particularly preferred. When methyltrimethoxysilane and/or methyltriethoxysilane are/is used in an amount of 70 mol % or more based on the total of all the alkylalkoxysilanes, a cured product having good balance between heat resistance and refractive index is obtained advantageously. Hydrolyzates of the compounds represented by the above formula (1) and condensates thereof are more preferred than the compounds. When the component (B) is a condensate of a compound represented by the above formula (1) its weight average molecular weight in terms of polystyrene is preferably 500 to 100,000, more preferably 5,000 to 50,000. When the weight average molecular weight in terms of polystyrene is lower than 500, the obtained coating film is not fully cured and hardly obtains mechanical strength. When the weight average molecular weight in terms of polystyrene is higher than 100,000, high crosslinking contrast between the exposed portion and the unexposed portion is hardly obtained with the result that the difference in refractive index between the exposed portion and the unexposed portion tends to be small.

The hydrolytic reaction and/or condensation reaction of the hydrolyzate of the compound represented by the above formula (1) and/or condensate thereof as the component (B) are/is carried out in the presence of water and a suitable catalyst as will be described below.

Stated more specifically, the compound represented by the above formula (1) is dissolved in a suitable organic solvent, and water is added to the resulting solution intermittently or continuously. The catalyst may be dissolved or dispersed in the organic solvent, or dissolved or dispersed in water to be added.

The temperature for carrying out the hydrolytic reaction and/or condensation reaction is preferably 0 to 100° C., more preferably 15 to 80° C.

Water for carrying out the hydrolysis and/or condensation of the compound represented by the above formula (1) is not particularly limited but preferably ion exchange water.

The amount of water is 0.25 to 3 mols, preferably 0.3 to 2.5 mols based on 1 mol of the total of the groups represented by $R^2O—$ of the compound represented by the above formula (1).

The catalyst for carrying out the hydrolysis and/or condensation of the compound represented by the above formula (1) is, for example, a metal chelate compound, organic acid, inorganic acid, organic base or inorganic base.

Examples of the metal chelate compound used as the catalyst include titanium chelate compounds such as triethoxy•mono(acetylacetonato)titanium, tri-n-propoxy•mono(acetylacetonato)titanium, tri-i-propoxy•mono(acetylacetonato)titanium, tri-n-butoxy•mono(acetylacetonato)titanium, tri-sec-butoxy•mono(acetylacetonato)titanium, tri-t-butoxy•mono(acetylacetonato)titanium, diethoxy bis(acetylacetonato)titanium, di-n-propoxy•bis(acetylacetonato)titanium, di-i-propoxy•bis(acetylacetonato)titanium, di-n-butoxy•bis(acetylacetonato)titanium, di-sec-butoxy•bis(acetylacetonato)titanium, di-t-butoxy•bis(acetylacetonato)titanium, monoethoxy•tris(acetylacetonato)titanium, mono-n-propoxy•tris(acetylacetonato)titanium, mono-i-propoxy•tris(acetylacetonato)titanium, mono-n-butoxy•tris(acetylacetonato)titanium, mono-sec-butoxy•tris(acetylacetonato)titanium, mono-t-butoxy•tris(acetylacetonato)titanium, tetrakis(acetylacetonato)titanium, triethoxy•mono(ethylacetoacetate)titanium, tri-n-propoxy•mono(ethylacetoacetate)titanium, tri-i-propoxy•mono(ethylacetoacetate)titanium, tri-n-butoxy•mono(ethylacetoacetate)titanium, tri-sec-butoxy•mono(ethylacetoacetate)titanium, tri-t-butoxy•mono(ethylacetoacetate)titanium, diethoxy•bis(ethylacetoacetate)titanium, di-n-propoxy•bis(ethylacetoacetate)titanium, di-i-propoxy•bis(ethylacetoacetate)titanium, di-n-butoxy•bis(ethylacetoacetate)titanium, di-sec-butoxy•bis(ethylacetoacetate)titanium, di-t-butoxy•bis(ethylacetoacetate)titanium, monoethxy•tris(ethylacetoacetate)titanium, mono-n-propoxy•tris(ethylacetoacetate)titanium, mono-i-propoxy•tris(ethylacetoacetate)titanium, mono-n-butoxy•tris(ethylacetoacetate)titanium, mono-sec-butoxy•tris(ethylacetoacetate)titanium, mono-t-butoxy•tris(ethylacetoacetate)titanium, tetrakis(ethylacetoacetate)titanium, mono(acetylacetonato)tris(ethylacetoacetate)titanium, bis(acetylacetonato)bis(ethylacetoacetate)titanium and tris(acetylacetonato)mono(ethylacetoacetate)titanium; zirconium chelate compounds such as triethoxy•mono (acetylacetonato)zirconium, tri-n-propoxy•mono(acetylacetonato)zirconium, tri-i-propoxy•mono(acetylacetonato)zirconium, tri-n-butoxy•mono(acetylacetonato)zirconium, tri-sec-butoxy•mono(acetylacetonato)zirconium, tri-t-butoxy•mono(acetylacetonato)zirconium, diethoxy•bis(acetylacetonato)zirconium, di-n-propoxy•bis(acetylacetonato)zirconium, di-i-propoxy•bis(acetylacetonato)zirconium, di-n-butoxy•bis(acetylacetonato)zirconium, di-sec-butoxy•bis(acetylacetonato)zirconium, di-t-butoxy•bis(acetylacetonato)zirconium, monoethoxy•tris(acetylacetonato)zirconium, mono-n-propoxy•tris(acetylacetonato)zirconium, mono-i-propoxy•tris(acetylacetonato)zirconium, mono-n-butoxy•tris(acetylacetonato)zirconium, mono-sec-butoxy•tris(acetylacetonato)zirconium, mono-t-butoxy•tris(acetylacetonato)zirconium, tetrakis(acetylacetonato)zirconium, triethoxy•mono(ethylacetoacetate)zirconium, tri-n-propoxy•mono(ethylacetoacetate)zirconium, tri-i-propoxy•mono(ethylacetoacetate)zirconium, tri-n-butoxy•mono(ethylacetoacetate)zirconium, tri-sec-butoxy•mono(ethylacetoacetate)zirconium, tri-t-butoxy•mono(ethylacetoacetate)zirconium, diethoxy•bis(ethylacetoacetate)zirconium, di-n-propoxy•bis(ethylacetoacetate)zirconium, di-i-propoxy•bis(ethylacetoacetate)zirconium, di-n-butoxy•bis(ethylacetoacetate)zirconium, di-sec-butoxy•bis(ethylacetoacetate)zirconium, di-t-butoxy•bis(ethylacetoacetate)zirconium, monoethoxy•tris(ethylacetoacetate)zirconium, mono-n-propoxy•tris(ethylacetoacetate)zirconium, mono-i-propoxy•tris(ethylacetoacetate)zirconium, mono-n-butoxy•tris(ethylacetoacetate)zirconium, mono-sec-butoxy•tris(ethylacetoacetate)zirconium, mono-t-butoxy•tris(ethylacetoacetate)zirconium, tetrakis(ethylacetoacetate)zirconium, mono(acetylacetonato)tris(ethylacetoacetate)zirconium, bis(acetylacetonato)bis(ethylacetoacetate)zirconium and tris(acetylacetonato)mono(ethylacetoacetate)zirconium; and aluminum chelate compounds such as tris(acetylacetonato)aluminum and tris(ethylacetoacetate)aluminum.

Examples of the organic acid used as the catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid and tartaric acid.

Examples of the inorganic acid used as the catalyst include hydrochloric acid, nitric acid, sulfuric acid, hydrofluoric acid and phosphoric acid.

Examples of the organic base used as the catalyst include pyridine, pyrrole, piperazine, pyrrolidine, piperidine, picoline, trimethylamine, triethylamine, monoethanolamine, diethanolamine, dimethyl monomethanolamine, monomethyl diethanolamine, triethanolamine, diazabicyclooctane, diazabicyclononane, diazabicycloundecene and tetramethylammonium hydroxide.

Examples of the inorganic base used as the catalyst include ammonia, sodium hydroxide, potassium hydroxide, barium hydroxide and calcium hydroxide.

Out of these catalysts, metal chelate compounds, organic acids and inorganic acids are preferred, and titanium chelate compounds and organic acids are more preferred.

These catalysts may be used alone or in combination of two or more.

The amount of the catalyst is preferably 0.001 to 10 parts by weight, more preferably 0.01 to 10 parts by weight based on 100 parts by weight of the compound represented by the above formula (1) in terms of $SiO_2$.

After the hydrolysis and/or condensation of the compound represented by the above formula (1) are/is carried out, the residual water and an alcohol produced as a reaction by-product are preferably removed.

Known compounds listed above may be used as the polymerizable compound (B) in the present invention without restrictions but there is a case where a compound containing an aromatic ring, halogen atom or sulfur atom is advantageously used to increase the refractive index.

A hydrogen atom contained in all the compounds listed as the above compound (B) may be substituted by a chlorine atom, bromine atom, hydroxyl group, mercapto group, alkoxy group, alkylthio group, haloalkyl group, haloalkoxy group, haloalkylthio group, thioester group, mercaptoalkyl group, aryl group, aralkyl group or cyano group.

Examples of the above alkoxy group which may be linear or branched include methoxy group, ethoxy group, n-propoxy group, i-propoxy group, n-butoxy group, i-butoxy group, sec-butoxy group, t-butoxy group, n-pentyloxy group, neopentyloxy group and n-hexyloxy group.

Examples of the above alkylthio group which may be linear or branched include methylthio group, ethylthio group, n-propylthio group, i-propylthio group, n-butylthio group, i-butylthio group, sec-butylthio group, t-butylthio group, n-pentylthio group, neopentylthio group and n-hexylthio group.

Examples of the above haloalkyl group include trifluoromethyl group, pentafluoroethyl group, heptafluoropropyl group, chloromethyl group, 2-chloroethyl group, 3-chloropropyl group, 1-chloromethylethyl group, 4-chlorobutyl group, 2-chloromethylpropyl group, 5-chloropentyl group, 3-chloromethylbutyl group, 2-chloroethylpropyl group, 6-chlorohexyl group, 3-chloromethylpentyl group, 4-chloromethylpentyl group, 2-chloroethylbutyl group, bromomethyl group, 2-bromoethyl group, 3-bromopropyl group, 1-bromomethylethyl group, 4-bromobutyl group, 2-bromomethylpropyl group, 5-bromopentyl group, 3-bromomethylbutyl group, 2-bromoethylpropyl group, 6-bromohexyl group, 3-bromomethylpentyl group, 4-bromomethylpentyl group and 2-bromoethylbutyl group.

Examples of the above haloalkoxy group include trifluoromethoxy group, pentafluoroethoxy group, heptafluoropropoxy group, chloromethoxy group, 2-chloroethoxy group, 3-chloropropoxy group, 1-chloromethylethoxy group, 4-chlorobutoxy group, 2-chloromethylpropoxy group, 5-chloropentyloxy group, 3-chloromethylbutoxy group, 2-chloroethylpropoxy group, 6-chlorohexyloxy group, 3-chloromethylpentyloxy group, 4-chloromethylpentyloxy group, 2-chloroethylbutoxy group, bromomethoxy group, 2-bromoethoxy group, 3-bromopropoxy group, 1-bromomethylethoxy group, 4-bromobutoxy group, 2-bromomethylpropoxy group, 5-bromopentyloxy group, 3-bromomethylbutoxy group, 2-bromoethylpropoxy group, 6-bromohexyloxy group, 3-bromomethylpentyloxy group, 4-bromomethylpentyloxy group and 2-bromoethylbutoxy group.

Examples of the above haloalkylthio group include trifluoromethylthio group, pentafluoroethylthio group, heptafluoropropylthio group, chloromethylthio group, 2-chloroethylthio group, 3-chloropropylthio group, 1-chloromethylethylthio group, 4-chlorobutylthio group, 2-chloromethylpropylthio group, 5-chloropentylthio group, 3-chloromethylbutylthio group, 2-chloroethylpropylthio group, 6-chlorohexylthio group, 3-chloromethylpentylthio group, 4-chloromethylpentylthio group, 2-chloroethylbutylthio group, bromomethylthio group, 2-bromoethylthio group, 3-bromopropylthio group, 1-bromomethylethylthio group, 4-bromobutylthio group, 2-bromomethylpropylthio group, 5-bromopentylthio group, 3-bromomethylbutylthio group, 2-bromoethylpropylthio group, 6-bromohexylthio group, 3-bromomethylpentylthio group, 4-bromomethylpentylthio group and 2-bromoethylbutylthio group.

Examples of the above thioester group include acetylsulfanil group, propanoylsulfanil group, n-butanoylsulfanil group, i-butanoylsulfanil group, n-pantanoylsulfanil group, neopentanoylsulfanil group and n-hexanoylsulfanil group.

Examples of the above mercaptoalkyl group include mercaptomethyl group, 2-mercaptoethyl group, 3-mercaptopropyl group, 1-mercaptomethylethyl group, 4-mercaptobutyl group, 2-mercaptomethylpropyl group, 5-mercaptopentyl group, 3-mercaptomethylbutyl group, 2-mercaptoethylpropyl group, 6-mercaptohexyl group, 3-mercaptomethylpentyl group, 4-mercaptomethylpentyl group and 2-mercaptoethylbutyl group.

Examples of the above aryl group include phenyl group, tolyl group, xylyl group, cumenyl group and 1-naphthyl group.

Examples of the above aralkyl group include benzyl, α-methylbenzyl group, phenethyl group and naphthylmethyl group.

These compounds listed as the component (B) may be used alone or in combination of two or more.

The amount of the component (B) is preferably 5 to 95 parts by weight, more preferably 10 to 90 parts by weight based on 100 parts by weight of the total of the components (A) and (B). When the amount of the component (B) is smaller than 5 parts by weight, the refractive index changing material is apt to become fragile and when the amount is larger than 95 parts by weight, the obtained refractive index difference tends to become small.

(C) Radiation Sensitive decomposer

The radiation sensitive decomposer (C) used in the present invention can be a radiation sensitive acid generator, radiation sensitive base generator or radiation sensitive radical generator. When an acid reactive compound is used as the polymerizable compound (B), a radiation sensitive acid generator is preferably used as the radiation sensitive decomposer (C), when a base reactive compound is used as the polymerizable compound (B), a radiation sensitive base generator is preferably used as the radiation sensitive decomposer (C), and when a radical reactive compound is used as the polymerizable compound (B), a radiation sensitive radical generator is preferably used as the radiation sensitive decomposer (C).

The above radiation sensitive acid generator is, for example, a trichloromethyl-s-triazine, diaryl iodonium salt, triaryl sulfonium salt, quaternary ammonium salt or sulfonic acid ester.

Examples of the trichloromethyl-s-triazine include 2,4,6-tris(trichloromethyl)-s-triazine, 2-phenyl-4,6-bis(trichloromethyl)-s-triazine, 2-(4-chlorophenyl)-4,6-bis(trichloromethyl)-s-triazine, 2-(3-chlorophenyl)-4,6-bis(trichloromethyl)-s-triazine, 2-(2-chlorophenyl)-4,6-bis(trichloromethyl)-s-triazine, 2-(4-methoxyphenyl)-4,6-bis (trichloromethyl)-s-triazine, 2-(3-methoxyphenyl)-4,6-bis(trichloromethyl)-s-triazine, 2-(2-methoxyphenyl)-4,6-bis(trichloromethyl)-s-triazine, 2-(4-methylthiophenyl)-4,6-bis(trichloromethyl)-s-triazine, 2-(3-methylthiophenyl)-4,6-bis(trichloromethyl)-s-triazine, 2-(2-methylthiophenyl)-4,6-bis(trichloromethyl)-s-triazine, 2-(4-methoxynaphthyl)-4,6-bis(trichloromethyl)-s-triazine, 2-(3-methoxynaphthyl)-4,6-bis(trichloromethyl)-s-triazine, 2-(2-methoxynaphthyl)-4,6-bis(trichloromethyl)-s-triazine, 2-(4-methoxy-β-styryl)-4,6-bis(trichloromethyl)-s-triazine, 2-(3-methoxy-β-styryl)-4,6-bis(trichloromethyl)-s-triazine, 2-(2-methoxy-β-styryl)-4,6-bis(trichloromethyl)-s-triazine, 2-(3,4,5-trimethoxy-β-styryl)-4,6-bis(trichloromethyl)-s-triazine, 2-(4-methylthio-β-styryl)-4,6-bis(trichloromethyl)-s-triazine, 2-(3-methylthio-β-styryl)-4,6-bis(trichloromethyl)-s-triazine, 2-(3-methylthio-β-styryl)-4,6-bis(trichloromethyl)-s-triazine, 2-piperonyl-4,6-bis(trichloromethyl)-s-triazine, 2-[2-(furan-2-yl)ethenyl]-4,6-bis(trichloromethyl)-s-triazine, 2-[2-(5-methylfuran-2-yl)ethenyl]-4,6-bis(trichloromethyl)-s-triazine and 2-[2-(4-diethylamino-2-methylphenyl)ethenyl]-4,6-bis(trichloromethyl)-s-triazine.

Examples of the above diaryl iodonium salt include diphenyliodonium tetrafluoroborate, diphenyliodonium hexafluorophosphonate, diphenyliodonium hexafluoroarsenate, diphenyliodonium trifluoromethane sulfonate, diphenyliodonium trifluoroacetate, diphenyliodonium-p-toluene sulfonate, diphenyliodonium butyltris(2,6-difluorophenyl)borate, diphenyliodonium hexyltris(p-chlorophenyl)borate, diphenyliodonium hexyltris(3-trifluoromethylphenyl)borate, 4-methoxyphenylphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethane sulfonate, 4-methoxyphenylphenyliodonium trifluoroacetate, 4-methoxyphenylphenyliodonium-p-toluene sulfonate, 4-methoxyphenylphenyliodonium butyltris(2,6-difluorophenyl)borate, 4-methoxyphenylphenyliodonium hexyltris(p-chlorophenyl)borate, 4-methoxyphenylphenyliodonium hexyltris(3-trifluoromethylphenyl)borate, bis(4-tert-butylphenyl)iodonium tetrafluoroborate, bis(4-tert-butylphenyl)iodonium hexafluoroarsenate, bis(4-tert-butylphenyl)iodonium trifluoromethane sulfonate, bis(4-tert-butylphenyl)iodonium trifluoroacetate, bis(4-tert-butylphenyl)iodonium-p-toluene sulfonate, bis(4-tert-butylphenyl)iodonium butyltris(2,6-difluorophenyl)borate, bis(4-tert-butylphenyl)iodonium hexyltris(p-chlorophenyl)borate and bis(4-tert-butylphenyl)iodonium hexyltris(3-trifluoromethylphenyl)borate.

Examples of the above triaryl sulfonium salt include triphenylsulfonium tetrafluoroborate, triphenylsulfonium hexafluorophosphonate, triphenylsulfonium hexafluoroarsenate, triphenylsulfonium trifluoromethane sulfonate, triphenylsulfonium trifluoroacetate, triphenylsulfonium-p-toluene sulfonate, triphenylsulfonium butyltris(2,6-difluorophenyl)borate, triphenylsulfonium hexyltris(p-chlorophenyl)borate, triphenylsulfonium hexyltris(3-trifluoromethylphenyl)borate, 4-methoxyphenyldiphenylsulfonium tetrafluoroborate, 4-methoxyphenyldiphenylsulfonium hexafluorophosphonate, 4-methoxyphenyldiphenylsulfonium hexafluoroarsenate, 4-methoxyphenyldiphenylsulfonium trifluoromethane sulfonate, 4-methoxyphenyldiphenylsulfonium trifluoroacetate, 4-methoxyphenyldiphenylsulfonium-p-toluene sulfonate, 4-methoxyphenyldiphenylsulfonium butyltris(2,6-difluorophenyl)borate, 4-methoxyphenyldiphenylsulfonium hexyltris(p-chlorophenyl)borate, 4-methoxyphenyldiphenylsulfonium hexyltris(3-trifluoromethylphenyl)borate, 4-phenylthiophenyldiphenylsulfonium tetrafluoroborate, 4-phenylthiophenyldiphenylsulfonium hexafluorophosphonate, 4-phenylthiophenyldiphenylsulfonium hexafluoroarsenate, 4-phenylthiophenyldiphenylsulfonium trifluoromethane sulfonate, 4-phenylthiophenyldiphenylsulfonium trifluoroacetate, 4-phenylthiophenyldiphenylsulfonium-p-toluene sulfonate, 4-phenylthiophenyldiphenylsulfonium butyltris(2,6-difluorophenyl)borate, 4-phenylthiophenyldiphenylsulfonium hexyltris(p-chlorophenyl)borate, 4-phenylthiophenyldiphenylsulfonium hexyltris(3-trifluoromethylphenyl)borate, 4-hydroxy-1-naphthalenyldimethylsulfonium tetrafluoroborate, 4-hydroxy-1-naphthalenyldimethylsulfonium hexafluorophosphonate, 4-hydroxy-1-naphthalenyldimethylsulfonium hexafluoroarsenate, 4-hydroxy-1-naphthalenyldimethylsulfonium trifluoromethane sulfonate, 4-hydroxy-1-naphthalenyldimethylsulfonium trifluoroacetate, 4-hydroxy-1-naphthalenyldimethylsulfonium-p-toluene sulfonate, 4-hydroxy-1-naphthalenyldimethylsulfonium butyltris(2,6-difluorophenyl)borate, 4-hydroxy-1-naphthalenyldimethylsulfonium hexyltris(p-chlorophenyl)borate and 4-hydroxy-1-naphthalenyldimethylsulfonium hexyltris(3-trifluoromethylphenyl)borate.

Examples of the above quaternary ammonium salt include tetramethylammonium tetrafluoroborate, tetramethylammonium hexafluorophosphonate, tetramethylammonium hexafluoroarsenate, tetramethylammonium trifluoromethane sulfonate, tetramethylammonium trifluoroacetate, tetramethylammonium-p-toluene sulfonate, tetramethylammonium butyltris(2,6-difluorophenyl)borate, tetramethylammonium hexyltris(p-chlorophenyl)borate, tetramethylammonium hexyltris(3-trifluoromethylphenyl)borate, tetrabutylammonium tetrafluoroborate, tetrabutylammonium hexafluorophosphonate, tetrabutylammonium hexafluoroarsenate, tetrabutylammonium trifluoromethane sulfonate, tetrabutylammonium trifluoroacetate, tetrabutylammonium-p-toluene sulfonate, tetrabutylammonium butyltris(2,6-difluorophenyl)borate, tetrabutylammonium hexyltris(p-chlorophenyl)borate, tetrabutylammonium hexyltris(3-trifluoromethylphenyl)borate, benzyltrimethylammonium tetrafluoroborate, benzyltrimethylammonium hexafluorophosphonate, benzyltrimethylammonium hexafluoroarsenate, benzyltrimethylammonium trifluoromethane sulfonate, benzyltrimethylammonium trifluoroacetate, benzyltrimethylammonium-p-toluene sulfonate, benzyltrimethylammonium butyltris(2,6-difluorophenyl)borate, benzyltrimethylammonium hexyltris(p-chlorophenyl)borate, benzyltrimethylammonium hexyltris(3-trifluoromethylphenyl)borate, benzyldimethylphenylammonium tetrafluoroborate, benzyldimethylphenylammonium hexafluorophosphonate, benzyldimethylphenylammonium hexafluoroarsenate, benzyldimethylphenylammonium trifluoromethane sulfonate, benzyldimethylphenylammonium trifluoroacetate, benzyldimethylphenylammonium-p-toluene sulfonate, benzyldimethylphenylammonium butyltris(2,6-difluorophenyl)borate, benzyldimethylphenylammonium hexyltris(p-chlorophenyl)borate, benzyldimethylphenylammonium hexyltris(3-trifluoromethylphenyl)borate, N-cinnamylideneethylphenylammonium tetrafluoroborate, N-cinnamylideneethylphenylammonium hexafluorophosphonate, N-cinnamylideneethylphenylammonium hexafluoroarsenate, N-cinnamylideneethylphenylammonium trifluoromethane sulfonate, N-cinnamylideneethylphenylammonium trifluoroacetate, N-cinnamylideneethylphenylammonium-p-toluene sulfonate, N-cinnamylideneethylphenylammonium butyltris(2, 6-difluorophenyl)borate, N-cinnamylideneethylphenylammonium hexyltris(p-chlorophenyl)borate and N-cinnamylideneethylphenylammonium hexyltris(3-trifluoromethylphenyl)borate.

Examples of the above sulfonic acid ester include α-hydroxymethylbenzoin-p-toluenesulfonic acid ester, α-hydroxymethylbenzoin-trifluoromethanesulfonic acid ester, α-hydroxymethylbenzoin-methanesulfonic acid ester, pyrogallol-tri(p-toluenesulfonic acid)ester, pyrogallol-tri(trifluoromethanesulfonic acid) ester, pyrogallol-trimethanesulfonic acid ester, 2,4-dinitrobenzyl-p-toluenesulfonic acid ester, 2,4-dinitrobenzyl-trifluoromethanesulfonic acid ester, 2,4-dinitrobenzyl-methanesulfonic acid ester, 2,4-dinitrobenzyl-1,2-naphthoquinonediazido-5-sulfonic acid ester, 2,6-dinitrobenzyl-p-toluenesulfonic acid ester, 2,6-dinitrobenzyl-trifluoromethanesulfonic acid ester, 2,6-dinitrobenzyl-methanesulfonic acid ester, 2,6-dinitrobenzyl-1,2-naphthoquinonediazido-5-sulfonic acid ester, 2-nitrobenzyl-p-toluenesulfonic acid ester, 2-nitrobenzyl-trifluoromethanesulfonic acid ester, 2-nitrobenzyl-methanesulfonic acid ester, 2-nitrobenzyl-1,2-naphthoquinonediazido-5-sulfonic acid ester, 4-nitrobenzyl-p-toluenesulfonic acid ester, 4-nitrobenzyl-trifluoromethanesulfonic acid ester, 4-nitrobenzyl-methanesulfonic acid ester, 4-nitrobenzyl-1,2-naphthoquinonediazido-5-sulfonic acid ester, N-hydroxynaphthalimido-p-toluenesulfonic acid ester, N-hydroxynaphthalimido-trifluoromethanesulfonic acid ester, N-hydroxynaphthalimido-methanesulfonic acid ester, N-hydroxy-5-norbornene-2,3-dicarboxyimido-p-toluensulfonic acid ester, N-hydroxy-5-norbornene-2,3-dicarboxyimido-trifluoromethanesulfonic acid ester, N-hydroxy-5-norbornene-2,3-dicarboxyimido-methanesulfonic acid ester, 2,4,6,3',4',5'-hexahydroxybenzophenone-1,2-naphthoquinonediazido-4-sulfonic acid ester and 1,1,1-tri(p-hydroxyphenyl)ethane-1,2-naphthoquinonediazido-4-sulfonic acid ester.

Out of these compounds, 2-(3-chlorophenyl)-4,6-bis(trichloromethyl)-s-triazine, 2-(4-methoxyphenyl)-4,6-bis(trichloromethyl)-s-triazine, 2-(4-methylthiophenyl)-4,6-bis(trichloromethyl)-s-triazine, 2-(4-methoxy-β-styryl)-4,6-bis(trichloromethyl)-s-triazine, 2-piperonyl-4,6-bis(trichloromethyl)-s-triazine, 2-[2-(furan-2-yl)ethenyl]-4,6-bis(trichloromethyl)-s-triazine, 2-[2-(5-methylfuran-2-yl)ethenyl]-4,6-bis(trichloromethyl)-s-triazine, 2-[2-(4-diethylamino-2-methylphenyl)ethenyl]-4,6-bis(trichloromethyl)-s-triazine and 2-(4-methoxynaphthyl)-4,6-bis(trichloromethyl)-s-triazine are preferred as trichloromethyl-s-triazines; diphenyliodonium trifluoroacetate, diphenyliodonium trifluoromethane sulfonate, 4-methoxyphenylphenyliodonium trifluoromethane sulfonate and 4-methoxyphenylphenyliodonium trifluoroacetate are preferred as diaryl iodonium salts; triphenylsulfonium trifluoromethane sulfonate, triphenylsulfonium trifluoroacetate, 4-methoxyphenyldiphenylsulfonium trifluoromethane sulfonate, 4-methoxyphenyldiphenylsulfonium trifluoroacetate, 4-phenylthiophenyldiphenylsulfonium trifluoromethane sulfonate and 4-phenylthiophenyldiphenylsulfonium trifluoroacetate are preferred as triaryl sulfonium salts; tetramethylammonium butyltris(2,6-difluorophenyl)borate, tetramethylammonium hexyltris(p-chlorophenyl)borate, tetramethylammonium hexyltris(3-trifluoromethylphenyl)borate, benzyldimethylphenylammonium butyltris(2,6-difluorophenyl)borate, benzyldimethylphenylammonium hexyltris(p-chlorophenyl)borate and benzyldimethylphenylammonium hexyltris(3-trifluoromethylphenyl)borate are preferred as quaternary ammonium salts; and 2,6-dinitrobenzyl-p-toluenesulfonic acid ester, 2,6-dinitrobenzyl-trifluoromethanesulfonic acid ester, N-hydroxynaphthalimido-p-toluenesulfonic acid ester and N-hydroxynaphthalimido-trifluoromethanesulfonic acid ester are preferred as sulfonic acid esters.

What are disclosed by JP-A 4-330444 and U.S. Pat. No. 5,627,010 are advantageously used as the above radiation sensitive base generator. However, any radiation sensitive base generator is acceptable if it forms a base upon exposure to radiation as its function.

The radiation sensitive base generator in the present invention is preferably an optically active carbamate such as triphenyl methanol, benzyl carbamate or benzoin carbamate; amide such as O-carbamoyl hydroxylamide, O-carbamoyloxime, aromatic sulfonamide, alpha-lactam or N-(2-allylethinyl)amide, or other amide; oxime ester, α-aminoacetophenone or cobalt complex.

Examples of the radiation sensitive base generator include compounds represented by the following formulas (2) to (13):

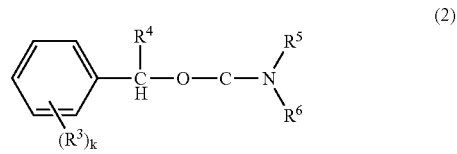

wherein $R^3$ is an alkyl group having 1 to 6 carbon atoms, alkoxy group having 1 to 6 carbon atoms, alkylthio group having 1 to 6 carbon atoms, dialkylamino group having 1 to 6 carbon atoms, piperidyl group, nitro group, hydroxy group, mercapto group, alkenyl group having 2 to 6 carbon atoms, alkynyl group having 2 to 6 carbon atoms, aryl group having 6 to 20 carbon atoms, fluorine atom, chlorine atom or bromine atom, k is an integer of 0 to 3, $R^4$ is a hydrogen atom, alkyl group having 1 to 6 carbon atoms, alkenyl group having 2 to 6 carbon atoms, alkynyl group having 2 to 6 carbon atoms or aryl group having 6 to 20 carbon atoms, and $R^5$ and $R^6$ are each independently a hydrogen atom, alkyl group having 1 to 6 carbon atoms, alkenyl group having 2 to 6 carbon atoms, alkynyl group having 2 to 6 carbon atoms, aryl group having 6 to 20 carbon atoms or benzyl group, or $R^5$ and $R^6$ may be bonded together to form a cyclic structure having 5 to 6 carbon atoms with nitrogen atoms bonded thereto,

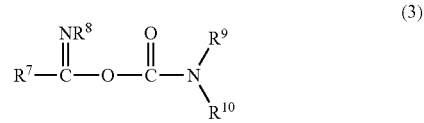

wherein $R^7$ is an alkyl group having 1 to 6 carbon atoms, alkoxy group having 1 to 6 carbon atoms, alkylthio group having 1 to 6 carbon atoms, dialkylamino group having 1 to 6 carbon atoms, piperidyl group, nitro group, hydroxy group, mercapto group, alkenyl group having 2 to 6 carbon atoms, alkynyl group having 2 to 6 carbon atoms or aryl group having 6 to 20 carbon atoms, $R^8$ is a hydrogen atom, alkyl group having 1 to 6 carbon atoms, alkenyl group having 2 to 6 carbon atoms, alkynyl group having 2 to 6 carbon atoms or aryl group having 6 to 20 carbon atoms, and $R^9$ and $R^{10}$ are each independently a hydrogen atom, alkyl group having 1 to 6 carbon atoms, alkenyl group having 2 to 6 carbon atoms, alkynyl group having 2 to 6 carbon atoms, aryl group having 6 to 20 carbon atoms or benzyl group, or $R^9$ and $R^{10}$ may be bonded together to form a cyclic structure having 5 to 6 carbon atoms with nitrogen atoms bonded thereto,

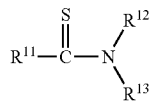

(4)

wherein $R^{11}$ is an alkyl group having 1 to 6 carbon atoms, alkenyl group having 2 to 6 carbon atoms, alkynyl group having 2 to 6 carbon atoms or aryl group having 6 to 20 carbon atoms, and $R^{12}$ and $R^{13}$ are each independently a hydrogen atom, alkyl group having 1 to 6 carbon atoms, alkenyl group having 2 to 6 carbon atoms, alkynyl group having 2 to 6 carbon atoms, aryl group having 6 to 20 carbon atoms or benzyl group, or $R^{12}$ and $R^{13}$ may be bonded together to form a cyclic structure having 5 to 6 carbon atoms with nitrogen atoms bonded thereto,

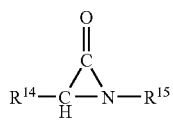

(5)

wherein $R^{14}$ and $R^{15}$ are each independently an alkyl group having 1 to 6 carbon atoms, alkenyl group having 2 to 6 carbon atoms, alkynyl group having 2 to 6 carbon atoms or aryl group having 6 to 20 carbon atoms,

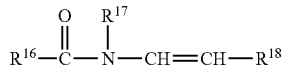

(6)

wherein R 16, $R^{17}$ and $R^{18}$ are each independently an alkyl group having 1 to 6 carbon atoms, alkenyl group having 2 to 6 carbon atoms, alkynyl group having 2 to 6 carbon atoms or aryl group having 6 to 20 carbon atoms,

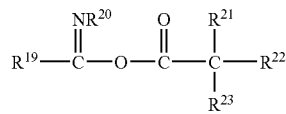

(7)

wherein $R^{19}$ is an alkyl group having 1 to 6 carbon atoms, alkoxy group having 1 to 6 carbon atoms, alkylthio group having 1 to 6 carbon atoms, dialkylamino group having 1 to 6 carbon atoms, piperidyl group, nitro group, hydroxy group, mercapto group, alkenyl group having 2 to 6 carbon atoms, alkynyl group having 2 to 6 carbon atoms or aryl group having 6 to 20 carbon atoms, $R^{20}$ is a hydrogen atom, alkenyl group having 2 to 6 carbon atoms, alkynyl group having 2 to 6 carbon atoms or aryl group having 6 to 20 carbon atoms, and $R^{21}$, $R^{22}$ and $R^{23}$ are each independently a hydrogen atom, alkyl group having 1 to 6 carbon atoms, alkenyl group having 2 to 6 carbon atoms, alkynyl group having 2 to 6 carbon atoms, aryl group having 6 to 20 carbon atoms or benzyl group,

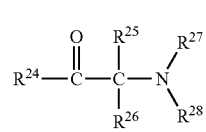

(8)

wherein $R^{24}$ is an alkyl group having 1 to 6 carbon atoms, alkoxy group having 1 to 6 carbon atoms, alkylthio group having 1 to 6 carbon atoms, dialkylamino group having 1 to 6 carbon atoms, piperidyl group, nitro group, hydroxy group, mercapto group, alkenyl group having 2 to 6 carbon atoms, alkynyl group having 2 to 6 carbon atoms or aryl group having 6 to 20 carbon atoms, $R^{25}$ and $R^{26}$ are each independently a hydrogen atom, hydroxy group, mercapto group, cyano group, phenoxy group, alkyl group having 1 to 6 carbon atoms, fluorine atom, chlorine atom, bromine atom or aryl group, and $R^{27}$ and $R^{28}$ are each independently a hydrogen atom, alkyl group having 1 to 6 carbon atoms, alkenyl group having 2 to 6 carbon atoms, alkynyl group having 2 to 6 carbon atoms, aryl group having 6 to 20 carbon atoms or benzyl group, or $R^{27}$ and $R^{28}$ may be bonded together to form a cyclic structure having 5 to 6 carbon atoms with nitrogen atoms bonded thereto,

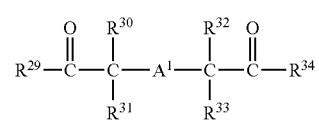

(9)

wherein $R^{29}$ and $R^{30}$ are each independently an alkyl group having 1 to 6 carbon atoms, alkoxy group having 1 to 6 carbon atoms, alkylthio group having 1 to 6 carbon atoms, dialkylamino group having 1 to 6 carbon atoms, piperidyl group, nitro group, hydroxy group, mercapto group, alkenyl group having 2 to 6 carbon atoms, alkynyl group having 2 to 6 carbon atoms or aryl group having 6 to 20 carbon atoms, $R^{31}$ to $R^{34}$ are each independently a hydrogen atom, hydroxy group, mercapto group, cyano group, phenoxy group, alkyl group having 1 to 6 carbon atoms, fluorine atom, chlorine atom, bromine atom, alkenyl group having 2 to 6 carbon atoms, alkynyl group having 2 to 6 carbon atoms or aryl group having 6 to 20 carbon atoms, and $A^1$ is a divalent group formed by excluding two hydrogen atoms bonded to one or two nitrogen atoms of a monoalkylamine, piperazine, aromatic diamine or aliphatic diamine,

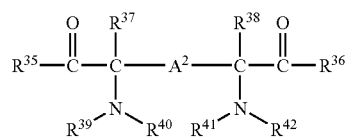

(10)

wherein $R^{35}$ and $R^{36}$ are each independently an alkyl group having 1 to 6 carbon atoms, alkoxy group having 1 to 6 carbon atoms, alkylthio group having 1 to 6 carbon atoms, dialkylamino group having 1 to 6 carbon atoms, piperidyl group, nitro group, hydroxy group, mercapto group, alkenyl group having 2 to 6 carbon atoms, alkynyl group having 2 to 6 carbon atoms or aryl group having 6 to 20 carbon atoms, $R^{37}$ and $R^{38}$ are each independently a hydrogen atom, hydroxy group, mercapto group, cyano group, phenoxy group, alkyl group having 1 to 6 carbon atoms, fluorine atom, chlorine atom, bromine atom, alkenyl group having 2 to 6 carbon atoms, alkynyl group having 2 to 6 carbon atoms or aryl group having 6 to 20 carbon atoms, $R^{39}$ to $R^{42}$ are each independently a hydrogen atom, alkyl group having 1 to 6 carbon atoms, alkenyl group having 2 to 6 carbon atoms, alkynyl group having 2 to 6 carbon atoms, aryl group having 6 to 20 carbon atoms or benzyl group, or $R^{39}$ and $R^{40}$, and $R^{41}$ and $R^{42}$ may be bonded together to form a cyclic structure having 5 to 6 carbon atoms with nitrogen atoms bonded thereto, and $A^2$ is an alkylene group having 1 to 6 carbon atoms, cyclohexylene group, phenylene group or single bond,

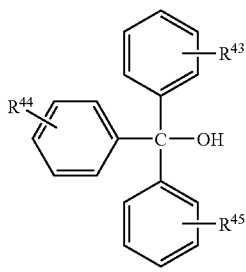
(11)

wherein $R^{43}$ to $R^{45}$ are each independently a hydrogen atom, fluorine atom, chlorine atom, bromine atom, alkyl group having 1 to 6 carbon atoms, alkoxy group having 1 to 6 carbon atoms, alkenyl group having 2 to 6 carbon atoms, alkynyl group having 2 to 6 carbon atoms or aryl group having 6 to 20 carbon atoms, $$L_m Co^{3+} \cdot 3[(R^{46})_3 R^{47}] \quad (12)$$

wherein L is at least one ligand selected from the group consisting of ammonia, pyridine, imidazole, ethylenediamine, trimethylenediamine, tetramethylenediamine, hexamethylenediamine, propylenediamine, 1,2-cyclohexanediamine, N,N-diethylethylenediamine and diethylenetriamine, m is an integer of 2 to 6, $R^{46}$ is an alkenyl group having 2 to 6 carbon atoms, alkynyl group having 2 to 6 carbon atoms or aryl group having 6 to 20 carbon atoms, and $R^{47}$ is an alkyl group having 1 to 18 carbon atoms,

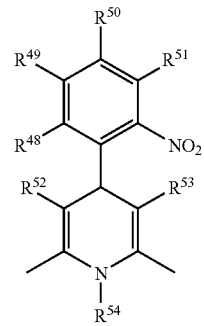
(13)

wherein $R^{48}$ to $R^{51}$ are each independently a hydrogen atom, nitro group, fluorine atom, chlorine atom, bromine atom, alkyl group having 1 to 6 carbon atoms, alkenyl group having 2 to 6 carbon atoms, alkynyl group having 2 to 6 carbon atoms, alkoxy group having 1 to 6 carbon atoms or aryl group, $R^{52}$ and $R^{53}$ are each independently an acetyl group, acetoxy group or cyano group, and $R^{54}$ is a hydrogen atom, alkyl group having 1 to 6 carbon atoms, aryl group or benzyl group.

In all the above formulas (2) to (13), the alkyl group maybe linear, branched or cyclic. Examples of the aryl group include phenyl group, naphthyl group, anthracenyl group and those obtained by substituting the hydrogen atoms of these groups by fluorine atom, chlorine atom, bromine atom, haloalkyl group, hydroxy group, carboxyl group, mercapto group, cyano group, nitro group, azido group, dialkylamino group, alkoxy group or alkylthio group.

Out of these radiation sensitive base generators, preferred are 2-nitrobenzylcyclohexyl carbamate, triphenyl methanol, O-carbamoylhydroxylamide, O-carbamoyloxime, [[(2,6-dinitrobenzyl)oxy]carbonyl]cyclohexylamine, bis[[(2-nitrobenzyl)oxy]carbonyl]hexane 1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexaamminecobalt(III) tris(triphenylmethylborate), 2-benzyl-2-dimethylamino-1-(4-morpholinophenyl)-butanone, 2,6-dimethyl-3,5-diacetyl-4-(2'-nitrophenyl)-1,4-dihydropyridine and 2,6-dimethyl-3,5-diacetyl-4-(2',4'-dinitrophenyl)-1,4-dihydropyridine.

Examples of the above radiation sensitive radical generator include α-diketones such as benzyl and diacetyl; acyloins such as benzoin; acyloin ethers such as benzoin methyl ether, benzoin ethyl ether and benzoin isopropyl ether; benzophenones such as thioxanthone, 2,4-diethylthioxanthone, thioxanthone-4-sulfonic acid, benzophenone, 4,4'-bis(dimethylamino)benzophenone and 4,4'-bis(diethylamino) benzophenone; acetophenones such as acetophenone, p-dimethylaminoacetophenone, α,α'-dimethoxyacetoxybenzophenone, 2,2'-dimethoxy-2-phenylacetophenone, p-methoxyacetophenone, 2-methyl[4-(methylthio)phenyl]-

2-morpholino-1-propanone and 2-benzyl-2-dimethylamino-1-(4-morpholinophenyl)-butan-1-one; quinones such as anthraquinone and 1,4-naphthoquinone; halogen compounds such as phenacyl chloride, tribromomethylphenylsulfone and tris(trichloromethyl)-s-triazine; acylphosphine oxides such as 2,4,6-trimethylbenzoyldiphenylphosphine oxide, bis(2,6-dimethoxybenzoyl)-2,4,4-trimethyl-pentylphosphine oxide and bis(2,4,6-trimethylbenzoyl)phenylphosphine oxide; and peroxides such as di-t-butyl peroxide.

Commercially available products of these radiation sensitive radical generators include IRGACURE-184, 369, 500, 651, 907, 1700, 819, 1000, 2959, 149, 1800 and 1850, and Darocur-1173, 1116, 2959, 1664 and 4043 (of Ciba Specialty Chemicals Co., Ltd.)., KAYACURE-DETX, -MBP, -DMBI, -EPA and -OA (of Nippon Kayaku Co., Ltd.), VICURE-10 and 55 (of STAUFFER Co., Ltd.), TRIGONALP1 (of AKZO Co., Ltd.), SANDORAY 1000 (of SANDOZ Co., Ltd.), DEAP (of APJOHN Co., Ltd.), and QUANTACURE-PDO, -ITX and -EPD (of WARD BLEKINSOP Co., Ltd.).

The radiation sensitive radical generator may be used in combination with a radiation sensitive sensitizer to obtain a high-sensitivity radiation sensitive resin composition.

When the above radiation sensitive decomposer (C) is a radiation sensitive acid generator or base generator, it is used in an amount of preferably 0.01 part or more by weight, more preferably 0.05 part or more by weight based on 100 parts by weight of the total of the inorganic oxide particle (A) and the polymerizable compound (B). When the amount of the radiation sensitive acid generator or base generator is smaller than 0.01 part by weight, its sensitivity to radiation tends to lower. The upper limit value is preferably 30 parts by weight, more preferably 20 parts by weight.

The radiation sensitive radical generator is used in an amount of preferably 1 to 50 parts by weight, more preferably 5 to 30 parts by weight based on 100 parts by weight of the total of the inorganic oxide particle (A) and the polymerizable compound (B). When the amount of the radiation sensitive radical generator is smaller than 1 part by weight, its sensitivity to radiation tends to lower.

The above compounds listed as the component (C) may be used alone or in combination of two or more.

(D) Escapable Compound

The escapable compound (D) used in the present invention is a known compound which decomposes, sublimes or evaporates to escape through volatilization or the like when it is heated. The heating temperature is preferably 70 to 400° C., more preferably 150 to 350° C. The refractive index of the component (D) is preferably 1.3 to 1.9, more preferably 1.4 to 1.9. The molecular weight of the escapable compound used as the component (D) is not particularly limited and may be as low as a monomer or oligomer.

The escapable compound is, for example, a polyether, fatty acid, fatty acid ester, hydrazide compound, hydrazone compound, azo compound or amino compound. Typical examples of the escapable compound are given below.

Examples of the polyether include polyethylene glycol, polypropylene glycol, block copolymer of polyethylene glycol and polypropylene glycol, random copolymer of polyethylene glycol and polypropylene glycol, fatty acid ester or alkyl ether obtained by modifying the terminal hydroxyl group of polyethylene glycol, fatty acid ester or alkyl ether obtained by modifying the terminal hydroxyl group of polypropylene glycol, fatty acid ester or alkyl ether obtained by modifying the terminal hydroxyl group of polyethylene glycol-polypropylene glycol copolymer, polyethylene glycol sorbitan fatty acid ester obtained by modifying sorbitan with ethylene glycol, polypropylene glycol sorbitan fatty acid ester obtained by modifying sorbitan with propylene glycol, polyethylene glycol-polypropylene glycol sorbitan fatty acid ester obtained by modifying sorbitan with polyethylene glycol-polypropylene glycol copolymer, polyether diol obtained by adding polyethylene glycol, polypropylene glycol or polyethylene glycol-polypropylene glycol copolymer to bisphenol A, polyether triol obtained by adding polyethylene glycol, polypropylene glycol or polyethylene glycol-polypropylene glycol copolymer to glycerin, and polyether tetraol obtained by adding polyethylene glycol, polypropylene glycol or polyethylene glycol-polypropylene glycol copolymer to ethylenediamine.

Examples of the fatty acid include butyric acid, valeric acid, caproic aid, caprylic acid, pelargonic acid, capric acid, lauric acid, myristic acid, palmitic acid and stearic acid. Unsaturated fatty acids obtained by substituting some or all of the single bonds of the above fatty acids by a double bond are also included.

Examples of the fatty acid ester include ethyl caprylate, ethyl pelargonate, methyl myristate, ethyl myristate, methyl palmitate, methyl stearate and methyl arachidate. Unsaturated fatty acid esters obtained by substituting some or all of the single bonds of the above fatty acid esters by a double bond are also included.

Examples of the hydrazide compound include hydrazide salicylate, hydrazide maleate, p-toluenesulfonyl hydrazide, p,p'-oxybisbenzenesulfonyl hydrazide, thiocarbonohydrazide, hydrazide 3-hydroxy-2-naphthoate, carbodihydrazide, dihydrazide adipinate, dihydrazide sebacate, dodecanediohydrazide, dihydrazide isophthalate, dihydrazide propionate, bis(cyclohexylidene)oxalodihydrazide and aminopolyacrylamide.

Examples of the hydrazone compound include benzophenone hydrazone, p-toluenesulfonylacetone hydrazone, carbonylcyanide m-chlorophenylhydrazone and carbonycyanide 3-chlorophenylhydrazone.

Examples of the azo compound include azodicarbonamide, diphenylcarbazone, diphenylthiocarbazone, 2,2'-azobisisobutyronitrile, 2,2'-azobis(2,4-dimethylvaleronitrile), 2,2'-azobis(2-methylbutyronitrile), 1,1'-azobis(1-acetoxy-1-phenylethane) and 2,2'-azobis(2-methylbutaneamidoxime).

Examples of the amine compound include caprylamine, laurylamine, stearylamine, oleylamine, myristylamine, cetylamine, triethanolamine and dinitrosopentamethylene tetramine.

The component (D) may serve as a dispersant for the inorganic oxide particle (A).

A hydrogen atom contained in the molecules of the above compounds may be substituted by an ethylenically unsaturated bond, epoxy group, ethylenesulfide group, oxetanyl group, isocyanate group, cyanate group, oxazolyl group, oxazyl group or silyl group which can be polymerized by an acid, base or radical formed from the radiation sensitive decomposer (C).

Known compounds listed above may be used as the escapable compound (D) in the present invention without restrictions but a compound containing an aromatic ring, halogen atom or sulfur atom may be advantageously used to increase the refractive index.

A hydrogen atom contained in all the compounds listed as the component (D) may be substituted by a chlorine atom, bromine atom, hydroxyl group, mercapto group, alkoxy group, alkylthio group, haloalkyl group, haloalkoxy group, haloalkylthio group, thioester group, mercaptoalkyl group, aryl group, aralkyl group or cyano group.

Examples of the above alkoxy group which may be linear or branched include methoxy group, ethoxy group, n-propoxy group, i-propoxy group, n-butoxy group, i-butoxy group, sec-butoxy group, t-butoxy group, n-pentyloxy group, neopentyloxy group and n-hexyloxy group.

Examples of the above alkylthio group which may be linear or branched include methylthio group, ethylthio group, n-propylthio group, i-propylthio group, n-butylthio group, i-butylthio group, sec-butylthio group, t-butylthio group, n-pentylthio group, neopentylthio group and n-hexylthio group.

Examples of the above haloalkyl group include trifluoromethyl group, pentafluoroethyl group, heptafluoropropyl group, chloromethyl group, 2-chloroethyl group, 3-chloropropyl group, 1-chloromethylethyl group, 4-chlorobutyl group, 2-chloromethylpropyl group, 5-chloropentyl group, 3-chloromethylbutyl group, 2-chloroethylpropyl group, 6-chlorohexyl group, 3-chloromethylpentyl group, 4-chloromethylpentyl group, 2-chloroethylbutyl group, bromomethyl group, 2-bromoethyl group, 3-bromopropyl group, 1-bromomethylethyl group, 4-bromobutyl group, 2-bromomethylpropyl group, 5-bromopentyl group, 3-bromomethylbutyl group, 2-bromoethylpropyl group, 6-bromohexyl group, 3-bromomethylpentyl group, 4-bromomethylpentyl group and 2-bromoethylbutyl group.

Examples of the above haloalkoxyl group include trifluoromethoxy group, pentafluoroethoxy group, heptafluoropropoxy group, chloromethoxy group, 2-chloroethoxy group, 3-chloropropoxy group, 1-chloromethylethoxy group, 4-chlorobutoxy group, 2-chloromethylpropoxy group, 5-chloropentyloxy group, 3-chloromethylbutoxy group, 2-chloroethylpropoxy group, 6-chlorohexyloxy group, 3-chloromethylpentyloxy group, 4-chloromethylpentyloxy group, 2-chloroethylbutoxy group, bromomethoxy group, 2-bromoethoxy group, 3-bromopropoxy group, 1-bomomethylethoxy group, 4-bromobutoxy group, 2-bromomethylpropoxy group, 5-bromopentyloxy group, 3-bromomethylbutoxy group, 2-bromoethylpropoxy group, 6-bromohexyloxy group, 3-bromomethylpentyloxy group, 4-bromomethylpentyloxy group and 2-bromoethylbutoxy group.

Examples of the above haloalkylthio group include trifluoromethylthio group, pentafluoroethylthio group, heptafluoropropylthio group, chloromethylthio group, 2-chloroethylthio group, 3-chloropropylthio group, 1-chloromethylethylthio group, 4-chlorobutylthio group, 2-chloromethylpropylthio group, 5-chloropentylthio group, 3-chloromethylbutylthio group, 2-chloroethylpropylthio group, 6-chlorohexylthio group, 3-chloromethylpentylthio group, 4-chloromethylpentylthio group, 2-chloroethylbutylthio group, bromomethylthio group, 2-bromoethylthio group, 3-bromopropylthio group, 1-bromomethylethylthio group, 4-bromobutylthio group, 2-bromomethylproylthio group, 5-bromopentylthio group, 3-bromomethylbutylthio group, 2-bromoethylpropylthio group, 6-bromohexylthio group, 3-bromomethylpentylthio group, 4-bromomethylpentylthio group and 2-bromoethylbutylthio group.

Examples of the above thioester group include acetylsulfanil group, propanoylsulfanil group, n-butanoylsulfanil group, i-butanoylsulfanil group, n-pentanoylsulfanil group, neopentanoylsulfanil group and n-hexanoylsulfanil group.

Examples of the above mercaptoalkyl group include mercaptomethyl group, 2-mercaptoethyl group, 3-mercaptopropyl group, 1-mercaptomethylethyl group, 4-mercaptobutyl group, 2-mercaptomethylpropyl group, 5-mercaptopentyl group, 3-mercaptomethylbutyl group, 2-mercaptoethylpropyl group, 6-mercaptohexyl group, 3-mercaptmethylpentyl group, 4-mercaptomethylpentyl group and 2-mercaptoethylbutyl group.

Examples of the above aryl group include phenyl group, tolyl group, xylyl group, cumenyl group and 1-naphthyl group.

Examples of the above aralkyl group include benzyl, α-methylbenzyl group, phenethyl group and naphthylmethyl group.

These compounds listed as the component (D) may be used alone or in combination of two or more.

The amount of the component (D) is preferably 1 to 99 parts by weight, more preferably 5 to 90 parts by weight based on 100 parts by weight of the total of the components (A) and (B). When the amount of the component (D) is smaller than 5 parts by weight, the obtained refractive index difference tends to become small and when the amount is larger than 99 parts by weight, the refractive index changing material is apt to become fragile.

<Other Components>

The refractive index changing composition of the present invention may contain other additives in limits that do not impair the object of the present invention. The additives include an ultraviolet light absorber, sensitizer, surfactant, heat resistance improving agent and adhesive aid.

The above ultraviolet light absorber is, for example, a benzotriazole, salicylate, benzophenone, substituted acrylonitrile, xanthene, coumarin, flavone or chalcone. Specific examples of the ultraviolet light absorber include Tinubin 234 (2-(2-hydroxy-3,5-bis(α,α-dimethylbenzyl)phenyl)-2H-benzotriazole), Tinubin 571 (hydroxyphenylbenzotriazole derivative) and Tinubin 1130 (condensate of methyl-3-(3-t-butyl-5-(2H-benzotriazol-2-yl)-4-hydroxyphenyl) propionate and polyethylene glycol (molecular weight of 300)) (of Ciba Specialty Chemicals Co., Ltd.), 1,7-bis(4-hydroxy-3-methoxyphenyl)-1,6-heptadiene-3,5-dione and dibenzylidene acetone.

By adding an ultraviolet light absorber, the amount of an acid or base formed from the component (C) can be made gradually smaller as the depth from the surface of the exposed portion of the refractive index changing material of the present invention increases, which is useful as means of forming GRIN. The amount of the ultraviolet light absorber is preferably 30 parts or less by weight, more preferably 20 parts or less by weight based on 100 parts by weight of the total of the components (A) and (B).

The above sensitizer is, for example, a coumarin having a substituent at the 3-position and/or 7-position, flavone, dibenzalacetone, dibenzalcyclohexane, chalcone, xanthene, thioxanthene, porphyrin, phthalocyanine, acridine or anthracene.

The amount of the sensitizer is preferably 30 parts or less by weight, more preferably 20 parts or less by weight based on 100 parts by weight of the total of the components (A) and (B).

The above surfactant may be added to improve coatability, for example, prevent striation, and to improve developability.

Examples of the surfactant include nonionic surfactants such as polyoxyethylene alkyl ethers including polyoxyethylene lauryl ether, polyoxyethylene stearyl ether and polyoxyethylene oleyl ether; polyoxyethylene aryl ethers including polyoxyethylene octylphenyl ether and polyoxyethylene nonylphenyl ether; and polyethylene glycol dialkyl esters including polyethylene glycol dilaurate and polyethylene glycol distearate; fluorine-based surfactants which are commercially available under the trade names of F Top EF301, EF303 and EF352 (of Shin Akita Kasei Co., Ltd.), Megafac F171, F172 and F173 (of Dainippon Ink and Chemicals, Inc.), Florade FC430 and FC431 (of Sumitomo 3M Limited), and Asahi Guard AG710, Surflon S-382, SC-101, SC-102, SC-103, SC-104, SC-105 and SC-106 (of Asahi Glass Co., Ltd.); and other surfactants which are commercially available under the trade names of o KP341 organosiloxane polymer (of Shin-Etsu Chemical Co., Ltd.) and Polyflow No. 57 and No. 95 acrylic or methacrylic acid-based (co)polymer (of Kyoeisha Kagaku Co., Ltd.).

The amount of the surfactant is preferably 2 parts or less by weight, more preferably 1 part or less by weight based on 100 parts by weight of the total of the components (A) and (B).

The above adhesive aid may be added to improve adhesion to a substrate and is preferably a silane coupling agent.

The above heat resistance improving agent is an unsaturated compound such as a polyacrylate.

An antistatic agent, keeping stabilizer, halation inhibitor, anti-foaming agent, pigment and acid thermal generator may be further added to the refractive index changing composition used in the present invention as required.

<Formation of Refractive Index Pattern>

In the present invention, a refractive index pattern can be formed from the above refractive index changing composition as follows, for example.

First, the refractive index changing composition is dissolved or dispersed in a solvent to prepare a composition solution having a solid content of 5 to 70 wt %. The composition solution may be filtered with a filter having an opening diameter of about 0.1 to 10 μm as required before use.

Thereafter, this composition solution is applied to the surface of a substrate such as a silicon wafer and prebaked to remove the solvent so as to form the coating film of the refractive index changing composition. Part of the formed coating film is then exposed to radiation through a pattern mask and baked after exposure (PEB) to make a difference in refractive index between the exposed and unexposed portions of the refractive index changing composition.

An acid, base or radical is formed from the radiation sensitive decomposer (C) by the above exposure to act on the polymerizable compound as the component (B) so that the component (B) is polymerized and crosslinked, thereby confining the escapable compound (D) and preventing the escape of the component (D). Since the above polymerization and crosslinking do not occur in the unexposed portion, the component (D) escapes, thereby making a difference in refractive index between the exposed and unexposed portions due to the existence and nonexistence of the component (D).

The solvent used to prepare a solution containing the refractive index changing composition used in the present invention uniformly dissolves or disperses the above components (A), (B), (C) and (D) and other additives and does not react with these components.

Examples of the solvent include alcohols such as methanol, ethanol, propanol, iso-propanol, butanol, ethylene glycol and propylene glycol; ethers such as tetrahydrofuran; cellosolves such as methyl cellosolve, ethyl cellosolve, propyl cellosolve and butyl cellosolve; ethylene glycol alkylether acetates such as methyl cellosolve acetate and ethyl cellosolve acetate; diethylene glycols such as diethylene glycol monomethyl ether, diethylene glycol monoethyl ether, diethylene glycol dimethyl ether, diethylene glycol ethyl methyl ether and diethylene glycol diethyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate; and fluorine atom-containing solvents such as trifluoromethylbenzene, 1,3-bis(trifluoromethyl)benzene, hexafluorobenzene, hexafluorocyclohexane, perfluorodimethylcyclohexane, perfluoromethylcyclohexane, octafluorodecalin and 1,1,2-trichloro-1,2,2-trifluoroethane.

Out of these solvents, alcohols, glycol ethers, ethylene glycol alkyl ether acetates, propylene glycol alkyl ether acetates, ketones, esters and diethylene glycols are preferred from the viewpoints of solubility, reactivity with each component and ease of forming a coating film.

Further, a high-boiling solvent may be used in combination with the above solvent. Examples of the high-boiling solvent include N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate and dietheylene glycol monobenzyl ether.

The refractive index changing composition used in the present invention is molded into various shapes in consideration of application purpose before exposure to radiation.

For example, it is molded like a rod, fiber, long board, sphere, film or lens to which the present invention is not limited. A commonly used method may be used to mold the refractive index changing composition of the present invention. For example, injection molding, compression molding, blow molding, extrusion, in-case frame polymerization, shaving, drawing, heating/cooling, CVD deposition, sintering or scanning may be employed. According to the application purpose of an optically molded product, spin coating, slitting, bar coating, solvent casting, LB, spraying, roll coating, relief-printing or screen printing may also be used.

In this molding process before exposure to radiation, heating (to be referred to as "prebaking" hereinafter) is preferably carried out. The heating condition which changes according to the composition of the material of the present invention and the type of each additive is preferably 30 to 200° C., more preferably 40 to 150° C. A hot plate or oven, or infrared radiation may be used for heating.

The radiation used for exposure is an i-ray having a wavelength of 365 nm, h-ray having a wavelength of 404 nm, g-ray having a wavelength of 436 nm, ultraviolet radiation from a wide wavelength light source such as a xenon lamp, far ultraviolet radiation such as a KrF excimer laser beam having a wavelength of 248 nm or an ArF excimer laser beam having a wavelength of 193 nm, X-radiation such as synchrotron radiation, charged corpuscular beam such as electron beam, visible radiation or a mixture thereof. Out of these, ultraviolet radiation and visible radiation are preferred. The illuminance which depends on the wavelength of the radiation is preferably 1 to 1,000 W/m$^2$ because the highest reaction efficiency is obtained. The radiation sensitive refractive index changing composition can be patterned by exposure to the above radiation through a pattern mask. As for patterning accuracy which is affected by a light source in use, an optical part having a refractive index change distribution with a resolution of about 0.2 μm can be produced.

In the present invention, heating (to be referred to as "post-exposure baking (PEB)") is preferably carried out after exposure. A similar device to the above prebaking device may be used for PEB, and PEB conditions may be arbitrary. The heating temperature is preferably 30 to 150° C., more preferably 30 to 130° C.

Further, re-exposure may be carried out to decompose the residual component (C) existent in the unexposed portion and further improve the stability of the material.

The re-exposure may be carried out by applying radiation having the same wavelength as the radiation used to change the refractive index to the entire surface of the pattern in the same amount.

Optionally, heating may be further carried out to completely escape the component (D) existent in the unexposed portion and to further improve the stability of the material. A similar device to the prebaking device used at the time of molding the material may be used for heating and the heating condition may be arbitrary.

In the refractive index pattern formed as described above of the present invention, the refractive index of the exposed portion is higher than that of the unexposed portion. This difference can be adjusted to a desired value by controlling the types and contents of the components (A) and (B) contained in the refractive index changing material used in the present invention. For example, the maximum value of refractive index difference can be adjusted to a value larger than 0.02.

Since the refractive index pattern of the present invention does not deteriorate without a change in refractive index even when it is used under the condition that light having a wavelength close to the wavelength used to change the refractive index passes therethrough as described above, it is extremely useful as an optical material for use in optoelectronic and display fields.

EXAMPLES

The following examples are provided for the purpose of further illustrating the present invention but are in no way to be taken as limiting.

The weight average molecular weight in terms of polystyrene of each compound was measured using the GPC CHROMATOGRAPH SYSTEM-21 of Showa Denko K.K.

Synthesis Example of Component (B)

Synthesis Example 1

7 parts by weight of 2,2'-azobis(2,4-dimethylvaleronitrile) and 200 parts by weight of diethylene glycol ethyl methyl ether were fed to a flask equipped with a cooling pipe and stirrer. Subsequently, 10 parts by weight of styrene, 20 parts by weight of methacrylic acid, 40 parts by weight of 2-(2'-vinyloxyethoxy)ethyl methacrylate and 25 parts by weight of dicyclopentanyl methacrylate were fed to the flask, the inside of the flask was substituted by nitrogen, and further 5 parts by weight of 1,3-butadiene was fed to the flask and stirred gently. The solution was heated at 70° C. and maintained at that temperature for 5 hours to obtain a polymer solution containing a copolymer (B-1). The solid content of the obtained polymer solution was 33.5%, and the weight average molecular weight of the polymer (B-1) was 29,000.

Synthesis Example 2

After the inside of a 500 ml three-necked flask equipped with a stirrer and thermometer was fully substituted by nitrogen, 140 g of toluene, 24 g of styrene and 4.9 g of 2-isopropenyl-2-oxazoline were added to the flask at the same time. After the inside temperature of the flask was raised to 100° C., 2.3 g of 2,2'-azobis-2,4-dimethylvaleronitrile was added as an initiator to start a reaction. Thereafter, 61.5 g of styrene, 4.9 g of the initiator and 61.5 g of toluene were added dropwise to the reaction solution in 3.5 hours simultaneously. Then, the reaction product was aged for 1.5 hours to obtain a light yellow polymer solution.

The obtained polymer solution was diluted with 400 g of toluene and injected into 2 liters of methanol for precipitation, and the precipitate was dissolved in 400 g of toluene and injected into 2 liters of methanol again to be purified by re-precipitation. After vacuum drying at 120° C., 62 g of a polymer (B-2) was obtained. The weight average molecular weight of the obtained polymer (B-2) was 160,000.

Synthesis Example 3

71 g of phenyltrimethoxysilane and 10 g of methyltrimethoxysilane were fed to a 500 ml three-necked flask equipped with a stirrer and thermometer, 90 g of n-BuOH was added to and dissolved in the mixture, and the obtained mixture solution was heated at 60° C. under agitation with a magnetic stirrer. A solution prepared by adding 1.2 g of 1N hydrochloric acid to 40 g of a 1:1 mixed solution of ion exchange water and n-BuOH was continuously added to the resulting solution in 10 minutes. After 4 hours of a reaction at 60° C., the obtained reaction solution was cooled to room temperature.

Thereafter, methanol which was a reaction by-product was distilled off from the reaction solution under reduced pressure, and the reaction solution was concentrated to a solid content of 30 wt % to obtain a solution containing a polymer (B-3). The weight average molecular weight of this polymer (B-3) was 5,000.

Synthesis Example 4

50 g of methyltrimethoxysilane, 90 g of propylene glycol methyl ether and 0.25 g of tetrakis(acetylacetonato)titanium were fed to a 500 ml three-necked flask equipped with a stirrer and thermometer to be dissolved, and the obtained mixed solution was heated at 60° C. under agitation with a magnetic stirrer. 40 g of a 1:1 mixed solution of ion exchange water and propylene glycol methyl ether was continuously added to the resulting solution in 1 hour. After 4 hours of a reaction at 60° C., the obtained reaction solution was cooled to room temperature.

Thereafter, methanol which was a reaction by-product was distilled off from the reaction solution under reduced pressure, and the solution was concentrated to a solid content of 30 wt % to obtain a solution containing a polymer (B-4). The average molecular weight of this polymer (B-4) was 10,000.

Example 1

90 parts by weight of $ZrO_2$ particle as the component (A) dispersed in 3 parts by weight of Homogenol L-18, a special polycarboxylic acid type polymer surfactant (of Kao Corporation) as a dispersant, 8 parts by weight of the polymer (B-1) as the component (B), 10 parts by weight of 4,4'-bis(diethylamino)benzophenone as the component (C) and 12 parts by weight of stearic acid as the component (D) were dissolved in diethylene glycol ethyl methyl ether to a total solid content of 20%, and the resulting solution was filtered with a membrane filter having an opening diameter of 0.2 μm to prepare a refractive index changing composition.

(1) Formation of Coating Film

The above composition was applied to a silicon substrate with a spinner and prebaked on a hot plate at 100° C. for 1 minute to form a 1.0 μm-thick coating film.

(2) Formation of Refractive Index Pattern

The coating film obtained as described above was exposed to 4,000 $J/m^2$ and 8,000 $J/m^2$ of radiation at the optimum focusing depth with the NSR1505i6A reduction projection exposure device (of Nikon Corporation, NA=0.45, λ=365 nm) through a pattern mask. The coating film was then baked at 220° C. for 30 minutes to form a refractive index pattern having a difference in refractive index between exposed and unexposed portions.

(3) Measurement of Refractive Index

The refractive indices of the exposed portion and the unexposed portion of the refractive index pattern formed above were measured at 633 nm with the MODEL2010 prism coupler (of METRICON Co., Ltd.) and #200-P-1 or #200-P-2 measurement prism. The results are shown in Table 1.

(4) Measurement of Porosity with Mercury Porosimeter

The porosities of the low refractive index portion and high refractive index portion of the refractive index pattern formed above were measured with a mercury porosimeter (Autopore 9200 of Shimadzu Corporation having a minimum measurable pore diameter of 34 Å).

(5) Evaluation of Transparency

A refractive index pattern was formed on a glass substrate in the same manner as in (1) and (2) except that the Corning 1737 glass substrate(of Corning Co., Ltd.) was used in place of the silicon substrate.

The transmittances of the exposed portion and the unexposed portion of the refractive index pattern formed on the glass substrate were measured at a wavelength of 400 to 800 nm with the 150-20 double beam spectrophotometer (of Hitachi, Ltd.). The results of transparency at 400 nm are shown in Table 1.

Example 2

Evaluations were carried out in the same manner as in Example 1 except that 10 parts by weight of the polymer (B-1) was used as the component (B) and 12 parts by weight of dinitrosopentamethylenetetramine was used as the component (D). The results are shown in Table 1.

Example 3

Evaluations were carried out in the same manner as in Example 1 except that 10 parts by weight of the polymer (B-3) as the component (B), 1 part by weight of 4-hydroxy-1-naphthalenyldimethylsulfonium trifluoroacetate as the component (C) and 12 parts by weight of azocarbonamide as the component (D) were used and post-exposure baking was carried out at 80° C. for 5 minutes. The results are shown in Table 1.

Example 4

Evaluations were carried out in the same manner as in Example 1 except that a dispersion of 85 parts by weight of $TiO_2$ particle as the component (A) and 15 parts by weight of the polymer (B-2) as the component (B) dispersed in 12 parts by weight of the PE-62 polyethylene glycol-polypropylene glycol block copolymer (of Sanyo Chemical Industries, Ltd.) as the component (D) was used. The results are shown in Table 1.

Example 5

Evaluations were carried out in the same manner as in Example 4 except that 15 parts by weight of the polymer (B-4) as the component (B) and 7 parts by weight of 2,6-dimethyl-3,5-diacetyl-4-(2',4'-dinitrophenyl)-1,4-dihydropyridine as the component (C) were used and post-exposure baking was carried out at 110° C. for 1 minute. The results are shown in Table 1.

Example 6

Evaluations were carried out in the same manner as in Example 4 except that 15 parts by weight of the polymer (B-1) as the component (B) and 5 parts by weight of 4-trimethyl-pentylphosphine oxide as the component (C) were used. The results are shown in Table 1.

Example 7

Evaluations were carried out in the same manner as in Example 1 except that a dispersion of 85 parts by weight of Al₂O₃ particle as the component (A) and 15 parts by weight of the polymer (B-1) as the component (B) dispersed in 8 parts by weight of the PEG-200 polyethylene glycol (of Sanyo Chemical Industries, Ltd.) as the component (D) was used. The results are shown in Table 1.

Example 8

Evaluations were carried out in the same manner as in Example 7 except that 15 parts by weight of the polymer (B-3) as the component (B) and 5 parts by weight of 6-diamine-4-(methylthiobenzoyl)-1-methyl-1-morpholino-ethane as the component (C) were used and post-exposure baking was carried out at 80° C. for 3 minutes. The results are shown in Table 1.

Example 9

Evaluations were carried out in the same manner as in Example 7 except that 15 parts by weight of the polymer (B-4) as the component (B) and 5 parts by weight of triphenylsulfonium tetrafluoroborate as the component (C) were used and post-exposure baking was carried out at 110° C. for 2 minutes. The results are shown in Table 1.

TABLE 1

|  | Amount of exposure | Refractive index | Porosity | Transparency |
|---|---|---|---|---|
| Example 1 | 0 J/m² | 1.58 | 12.0% | 95.2 |
|  | 4,000 J/m² | 1.68 | 4.3% | 96.5 |
|  | 8,000 J/m² | 1.74 | 0.1% | 95.2 |
| Example 2 | 0 J/m² | 1.56 | 14.9% | 95.4 |
|  | 4,000 J/m² | 1.66 | 9.6% | 97.2 |
|  | 8,000 J/m² | 1.70 | 0.3% | 95.3 |
| Example 3 | 0 J/m² | 1.57 | 16.3% | 96.1 |
|  | 4,000 J/m² | 1.67 | 10.9% | 95.1 |
|  | 8,000 J/m² | 1.71 | 0.5% | 95.2 |
| Example 4 | 0 J/m² | 1.73 | 18.0% | 87.1 |
|  | 4,000 J/m² | 1.82 | 7.9% | 85.2 |
|  | 8,000 J/m² | 1.89 | 0.5% | 84.1 |
| Example 5 | 0 J/m² | 1.69 | 18.8% | 88.2 |
|  | 4,000 J/m² | 1.80 | 5.9% | 85.1 |
|  | 8,000 J/m² | 1.85 | 0.6% | 84.1 |
| Example 6 | 0 J/m² | 1.68 | 15.0% | 87.1 |
|  | 4,000 J/m² | 1.77 | 3.8% | 83.4 |
|  | 8,000 J/m² | 1.80 | 0.1% | 82.1 |
| Example 7 | 0 J/m² | 1.48 | 15.8% | 94.3 |
|  | 4,000 J/m² | 1.55 | 5.3% | 95.1 |
|  | 8,000 J/m² | 1.57 | 0.5% | 95.2 |
| Example 8 | 0 J/m² | 1.48 | 15.8% | 97.9 |
|  | 4,000 J/m² | 1.55 | 3.5% | 95.1 |
|  | 8,000 J/m² | 1.57 | 0.4% | 96.3 |
| Example 9 | 0 J/m² | 1.50 | 15.3% | 97.1 |
|  | 4,000 J/m² | 1.57 | 11.9% | 96.1 |
|  | 8,000 J/m² | 1.59 | 0.4% | 96.2 |

Since the refractive index pattern formed by the method of the present invention has a sufficiently large refractive index difference and the obtained refractive index difference is stable to light and heat, it is extremely useful as an optical material for use in optoelectronic and display fields. The refractive index pattern of the present invention is further used as an optical material for photoarrays, lenses, photocouplers, photointerruptors, polarization beam splitters, holograms, single-mode and multi-mode optical fibers, bundle fibers, light guides, single-core, multi-core and photoelectric coupling optical connectors, optical isolators, polarizers, optical sensors such as photodiodes, phototransistors, photo-ICs, CCD image sensors, CMOS image sensors, optical fiber sensors and optical fiber gyros, optical disks such as CD, LD, PD and DVD, optical switches, waveguides, optical touch panels, diffraction gratings, optical guide plates, optical diffusers, anti-reflectors and optical sealers.

What is claimed is:

1. A radiation sensitive refractive index changing composition, comprising:
    (A) an inorganic oxide particle,
    (B) a polymerizable compound whose cross-linking density is increased by an acid, base or radical, each formed from a radiation sensitive decomposer (C),
    (C) said radiation sensitive decomposer, and
    (D) 5 to 99 parts by weight of an escapable compound, based on 100 parts by weight of the total components (A) and (B);
    wherein a film of said radiation sensitive refractive index changing composition exhibits a difference between a refractive index of an unexposed portion and a refractive index of an exposed portion of said film of larger than 0.02.

2. The radiation sensitive refractive index changing composition according to claim 1, wherein the component (C) decomposes upon exposure to radiation to form a decomposed product selected from the group consisting of an acid, a base and a radical, and said decomposed product increases the molecular weight of the component (B).

3. The radiation sensitive refractive index changing composition according to claim 1, wherein said inorganic particle has a particle diameter smaller than the wavelength of light used for the composition.

4. The radiation sensitive refractive index changing composition according to claim 1, wherein said inorganic oxide particle has a particle diameter of 2 μm or less.

5. The radiation sensitive refractive index changing composition according to claim 1, wherein said inorganic oxide particle has a surface modified by a silane coupling agent, a surfactant or a coordination compound having coordination capability to a metal atom of said oxide.

6. The radiation sensitive refractive index changing composition according to claim 1, wherein said component (B) has an ethylenically unsaturated bond, epoxy group, episulfide group, oxetanyl group, oxazolyl group, oxazinyl group or maleimide group, or said component (B) is a polysiloxane having the residual alkoxy group.

7. The radiation sensitive refractive index changing composition according to claim 1, wherein said component (C) is a trichloromethyl-s-triazine, diaryl iodonium salt, triaryl sulfonium salt, quaternary ammonium salt or sulfonic acid ester.

8. The radiation sensitive refractive index changing composition according to claim 1, wherein said component (C) is an optically active carbamate, an amide, an oxime ester, α-aminoacetophenone or cobalt complex.

9. The radiation sensitive refractive index changing composition according to claim 1, wherein said component (C) is an α-diketone, an acyloin ether, a benzophenone, an acetophenone, a quinine, a halogen compound, an acylphosphine oxide or a peroxide.

10. The radiation sensitive refractive index changing composition according to claim 1, wherein said component (D) is a compound which decomposes, sublimes or evaporates to escape through volatilization when it is heated.

11. The radiation sensitive refractive index changing composition according to claim 1, wherein a refractive index of said component (D) is 1.3 to 1.9.

12. A method of forming a refractive index pattern, comprising:

applying a refractive index changing composition to a substrate to obtain a coating film,
said composition comprising
(A) an inorganic oxide particle,
(B) a polymerizable compound,
(C) a radiation sensitive decomposer, and
(D) 5 to 99 parts by weight of an escapable compound, based on 100 parts by weight of the total components (A) and (B),
applying radiation to at least part of the coating film, and
heating the film to polymerize the polymerizable compound (B) of an exposed portion so as to confine the escapable compound (D) by crosslinking and escape the escapable compound (D) of an unexposed portion.

13. The method according to claim 12, wherein pores are formed in the unexposed portion by the escape of the escapable compound (D) of the unexposed portion through volatilization.

14. A refractive index pattern formed by the method of claim 12 or 13.

15. The refractive index pattern according to claim 14, comprising a first region having or not having pores, and a second region having no pores and a higher refractive index than the first region.

16. An optical material having a refractive index pattern formed by the method of claim 12 or 13.

17. The method according to claim 3, wherein said component (B) is a polymerizable compound whose crosslinking density is increased by an acid, base or radical, each formed from the radiation sensitive decomposer (C).

18. The method according to claim 3, wherein said film exhibits a difference between a refractive index of said unexposed portion and a refractive index of said exposed portion of said film of larger than 0.02.

19. The method according to claim 3, wherein said inorganic oxide particle has a particle diameter of 2 μm or less.

20. The method according to claim 3, wherein a refractive index of said component (D) is 1.3 to 1.9.

* * * * *